US009196460B2

(12) United States Patent
Hirayama et al.

(10) Patent No.: US 9,196,460 B2
(45) Date of Patent: *Nov. 24, 2015

(54) PLASMA PROCESSING APPARATUS AND PLASMA PROCESSING METHOD

(75) Inventors: Masaki Hirayama, Sendai (JP); Tadahiro Ohmi, Sendai (JP)

(73) Assignees: TOKYO ELECTRON LIMITED (JP); TOHOKU UNIVERSITY (JP)

( * ) Notice: Subject to any disclaimer, the term of this patent is extended or adjusted under 35 U.S.C. 154(b) by 1364 days.

This patent is subject to a terminal disclaimer.

(21) Appl. No.: 12/997,211

(22) PCT Filed: Jun. 3, 2009

(86) PCT No.: PCT/JP2009/060159
§ 371 (c)(1), (2), (4) Date: Apr. 6, 2011

(87) PCT Pub. No.: WO2009/150979
PCT Pub. Date: Dec. 17, 2009

(65) Prior Publication Data
US 2011/0180213 A1    Jul. 28, 2011

(30) Foreign Application Priority Data
Jun. 11, 2008    (JP) ................................ 2008-153379

(51) Int. Cl.
*H01J 37/32* (2006.01)

(52) U.S. Cl.
CPC ....... *H01J 37/3244* (2013.01); *H01J 37/32192* (2013.01); *H01J 37/32449* (2013.01)

(58) Field of Classification Search
CPC ............ H01J 37/3244; H01J 37/32192; H01J 37/32449
USPC ............ 118/723 E, 723 I, 723 MW, 723 AN, 118/723 R, 118; 156/345.33, 345.34
See application file for complete search history.

(56) References Cited

U.S. PATENT DOCUMENTS 5,091,049 A * 2/1992 Campbell et al. ................ 216/37
5,122,251 A * 6/1992 Campbell et al. ........ 204/298.06

(Continued)

FOREIGN PATENT DOCUMENTS

CN    1300875    6/2001
CN    1754008    3/2006

(Continued)

OTHER PUBLICATIONS

International Search Report-PCT/JP2009/060159 dated Sep. 1, 2009.

(Continued)

*Primary Examiner* — Jeffrie R Lund
(74) *Attorney, Agent, or Firm* — Cantor Colburn LLP

(57) ABSTRACT

A ratio between gas conductances of a main gas passage and a plurality of branch gas passages is increased. A plasma processing apparatus is an apparatus for plasma-processing an object to be processed by exciting gas, and includes a processing container; a gas supply source for supplying a desired gas; a main gas passage distributing the gas supplied from the gas supply source; a plurality of branch gas passages connected to a lower stream side of the main gas passage; a plurality of throttle portions formed on the plurality of branch gas passages to narrow the branch gas passages; and one, two, or more gas discharging holes per each of the branch gas passages, for discharging the gas that has passed through the plurality of throttle portions formed on the plurality of branch gas passages into the processing container.

47 Claims, 25 Drawing Sheets

(56) References Cited

U.S. PATENT DOCUMENTS

| | | | | |
|---|---|---|---|---|
| 5,525,159 | A | * | 6/1996 | Hama et al. ............... 118/723 I |
| 5,611,864 | A | * | 3/1997 | Kimura et al. ......... 118/723 MR |
| 5,620,523 | A | * | 4/1997 | Maeda et al. ........... 118/723 IR |
| 5,792,272 | A | * | 8/1998 | van Os et al. ............ 118/723 R |
| 6,042,687 | A | * | 3/2000 | Singh et al. .............. 156/345.33 |
| 6,132,552 | A | * | 10/2000 | Donohoe et al. ........ 156/345.33 |
| 6,162,323 | A | * | 12/2000 | Koshimizu ............... 156/345.26 |
| 6,286,454 | B1 | * | 9/2001 | Hirayama et al. .... 118/723 MW |
| 6,357,385 | B1 | * | 3/2002 | Ohmi et al. ............ 118/723 AN |
| 8,568,556 | B2 | * | 10/2013 | Hirayama et al. ....... 156/345.41 |
| 8,733,281 | B2 | * | 5/2014 | Hirayama et al. .... 118/723 MW |
| 2002/0047541 | A1 | * | 4/2002 | Okumura et al. ........ 315/111.21 |
| 2003/0207033 | A1 | | 11/2003 | Yim et al. |
| 2004/0206305 | A1 | | 10/2004 | Choi et al. |
| 2004/0238104 | A1 | * | 12/2004 | Suzuki et al. ................. 156/163 |
| 2006/0090704 | A1 | * | 5/2006 | Ide et al. ............... 118/723 MW |
| 2007/0059944 | A1 | * | 3/2007 | Matsuyama et al. .......... 438/775 |
| 2008/0081114 | A1 | | 4/2008 | Johanson et al. |
| 2008/0254220 | A1 | | 10/2008 | Tian et al. |
| 2008/0302761 | A1 | * | 12/2008 | Hirayama et al. .............. 216/67 |
| 2008/0303744 | A1 | * | 12/2008 | Hirayama et al. ............ 343/900 |
| 2009/0130335 | A1 | * | 5/2009 | Okumura et al. ............ 427/569 |
| 2009/0239364 | A1 | * | 9/2009 | Nishita et al. ................. 438/585 |
| 2010/0025821 | A1 | * | 2/2010 | Ohmi et al. ................... 257/607 |
| 2010/0096362 | A1 | * | 4/2010 | Hirayama et al. .............. 216/69 |
| 2010/0101728 | A1 | * | 4/2010 | Iwasaki ..................... 156/345.33 |
| 2010/0170872 | A1 | * | 7/2010 | Hirayama et al. .............. 216/67 |
| 2010/0183827 | A1 | * | 7/2010 | Hirayama et al. ............ 427/575 |
| 2010/0288439 | A1 | * | 11/2010 | Ishibashi et al. ......... 156/345.33 |
| 2011/0111557 | A1 | * | 5/2011 | Ichijo et al. ................... 438/104 |
| 2011/0114600 | A1 | * | 5/2011 | Hirayama et al. .............. 216/67 |
| 2011/0121736 | A1 | * | 5/2011 | Hirayama et al. ....... 315/111.41 |
| 2011/0146910 | A1 | * | 6/2011 | Hirayama et al. ....... 156/345.43 |
| 2011/0180213 | A1 | * | 7/2011 | Hirayama et al. ....... 156/345.33 |
| 2011/0259523 | A1 | * | 10/2011 | Hirayama ................ 156/345.35 |
| 2011/0303364 | A1 | * | 12/2011 | Hirayama et al. ....... 156/345.38 |
| 2013/0292047 | A1 | * | 11/2013 | Tian et al. ..................... 156/242 |
| 2014/0342575 | A1 | * | 11/2014 | Ito et al. ........................ 438/763 |
| 2014/0368110 | A1 | * | 12/2014 | Hirayama ....................... 315/39 |

FOREIGN PATENT DOCUMENTS

| | | | |
|---|---|---|---|
| JP | 02-114530 | 4/1990 | |
| JP | 10158847 | 6/1998 | |
| JP | 2000100805 | 4/2000 | |
| JP | 2006-515039 | 5/2006 | |
| JP | 2006-169588 | 6/2006 | |
| JP | 2007-273913 | 10/2007 | |
| KR | 10-2008-0037703 | 4/2008 | |
| WO | WO 2005117083 A1 * | 12/2005 | ............. H01L 21/31 |
| WO | WO 2008/153064 A1 * | 12/2008 | |

OTHER PUBLICATIONS

Chinese Office Action—Chinese Application No. 200980121462.6 issued on Mar. 29, 2006, citing CN1754008.

Korean Office Action—Korean Application No. 10-2010-7024030 issued on Jan. 12, 2012, citing KR 10-2008-0037703.

* cited by examiner

CROSS-SECTIONAL VIEW TAKEN ALONG LINE 1-1

CROSS-SECTIONAL VIEW TAKEN ALONG LINE 3-3

CROSS-SECTIONAL VIEW TAKEN ALONG LINE 4-4

CROSS-SECTIONAL VIEW TAKEN ALONG LINE 8-8

CROSS-SECTIONAL VIEW TAKEN ALONG LINE 11-O-O'-11

CROSS-SECTIONAL VIEW TAKEN ALONG LINE 10-10

CROSS-SECTIONAL VIEW TAKEN ALONG LINE 12-12

CROSS-SECTIONAL VIEW TAKEN ALONG LINE 13-13

CROSS-SECTIONAL VIEW TAKEN ALONG LINE 15-15

CROSS-SECTIONAL VIEW TAKEN ALONG LINE 17-17

PLASMA PROCESSING APPARATUS AND PLASMA PROCESSING METHOD

TECHNICAL FIELD

The present invention relates to a plasma processing apparatus and a plasma processing method for generating plasma by using electromagnetic waves and performing a plasma process on an object to be processed and, more particularly to an introduction of gas into a processing chamber.

BACKGROUND ART

In a plasma processing apparatus, a process such as a film formation or an etching that is accompanied with chemical reaction is performed. During performing the process, in order to generate the uniform plasma throughout an entire surface of the object to be processed, a density of a gas required to perform the process and a density of a reaction gas generated due to the chemical reaction should be constant. The gas is introduced into the processing chamber through a plurality of gas discharging holes that are formed with substantially regular pitches on a surface facing the object to be processed (for example, refer to Patent Document 1).

However, even when the plurality of gas discharging holes are formed with regular pitches, flow amount of the gas discharged from the gas discharging hole that is close to a gas supply source may be greater than flow amount of the gas discharged from the gas discharging hole that is far from the gas supply source. For example, when the gas is distributed from a main gas passage to a plurality of branch gas passages, if a gas conductance of the main gas passage is not sufficiently greater than the gas conductance of the branch gas passages, a sufficient amount of gas is discharged from the gas discharging hole formed on a branch gas passage that is close to the gas supply source, while the amount of gas reaching the branch gas passage that is far from the gas supply source is small, and thus, the branch gas passage that is far from the gas supply source may not discharge a sufficient amount of gas. Thus, the density of gas in the processing chamber is not uniform, and thus, the plasma may be generated nonuniformly. To avoid the above phenomenon, a gas supplying path should be designed so that the gas conductance of the main gas passage is sufficiently greater than the gas conductance of the plurality of branch gas passages, and thus, the gas may be distributed evenly from the main gas passage to the branch gas passages. (Patent Document 1) Japanese Laid-open Patent Publication No. hei 2-114530

DISCLOSURE OF THE INVENTION

Technical Problem

As a way of increasing the gas conductance of the main gas passage to be sufficiently greater than the gas conductance of the branch gas passages, the number of gas discharging holes may be reduced. However, when the number of the gas discharging holes is reduced, flow rate of the gas supplied to the object to be processed is not constant, and thus, the process cannot be performed uniformly.

Thus, as another way of increasing the gas conductance of the main gas passage to be sufficiently greater than the gas conductance of the branch gas passages, diameters of the gas discharging holes may be reduced. However, if the diameters of the gas discharging holes are reduced, the flow rate of gas reaches to a sound velocity of 360 m/s, and then, the gas discharged into the processing chamber is excessively agitated and the flow of the gas is scattered so as to excessively prompt chemical reactions. Thus, the process may not be performed well.

Thus, the present invention is to provide a plasma processing apparatus, which may increase a ratio between a gas conductance of a main gas passage and a gas conductance of a plurality of branch gas passages.

Technical Solution

To solve the above problems, according to an aspect of the present invention, there is provided a plasma processing apparatus for plasma-processing an object to be processed by exciting a gas, wherein the plasma processing apparatus includes: a processing container; a gas supply source which supplies a desired gas; a main gas passage through which the gas supplied from the gas supply source flows into the apparatus; a plurality of branch gas passages connected to a lower stream side of the main gas passage; a plurality of throttle portions which are formed on the plurality of branch gas passages to narrow the branch gas passages; and one, two, or more gas discharging holes per each of the branch gas passages which discharge the gas that has passed through the plurality of throttle portions formed on the plurality of branch gas passages into the processing container.

According to this invention, the plurality of throttle portions for narrowing the plurality of branch gas passages are formed on the plurality of branch gas passages. Accordingly, a ratio between gas conductances of the main gas passage and the plurality of branch gas passages may be increased. For example, the gas conductance of the throttle portion when the desired gas flows may be smaller than a sum of gas conductance of the one, two, or more gas discharging holes formed on a lower stream side of the corresponding throttle portion, and may be smaller than a gas conductance of the main gas passage. Thus, the gas may be distributed evenly to the plurality of branch gas passages from the main gas passage without regard to a distance from the gas supply source, and accordingly, the gas may be uniformly supplied to the processing chamber.

In addition, since the throttle portion is formed to be adjacent to the main gas passage to adjust the gas conductance at a basis of the branch gas passages, and thus, there is no need to adjust the gas conductance by narrowing the gas discharging holes formed on front ends of the branch gas passages as in the past. Therefore, the gas may be introduced into the processing chamber as a laminar flow while preventing the flow rate of the gas discharged into the processing chamber reaching the sound velocity and reducing the flow rate of the gas. Consequently, density of the gas in the processing chamber may be uniform, and the plasma may be generated uniformly.

The gas conductance of the throttle portion when the desired gas flows may be smaller than a sum of gas conductance of the one, two, or more gas discharging holes formed on a lower stream side of the corresponding throttle portion, and may be smaller than a gas conductance of the main gas passage.

The main gas passage and the plurality of branch gas passages may be buried in a lid of the processing container that faces the object to be processed.

The plurality of branch gas passages may be arranged at substantially regular pitches.

When it is assumed that the gas conductance of each throttle portion when the desired gas flows is Cr and the number of gas discharging holes formed on the lower stream side of the corresponding each throttle portion is N, values of Cr/N of the plurality of throttle portions may be substantially the same as each other.

When it is assumed that the gas conductance of each throttle portion when the desired gas flows is Cr and the number of gas discharging holes formed on the lower stream side of the corresponding each throttle portion is N, a value of Cr/N may be increased as the throttle portion becomes closer to a periphery portion of the plasma processing apparatus from a center of the plasma processing apparatus. Accordingly, the flow amount of the gas supplied to the periphery portion may be greater than the flow amount of the gas supplied to the center portion, and thus, density of plasma at the periphery portion may be maintained to be a predetermined level or higher.

As the throttle portion becomes closer to the periphery portion of the plasma processing apparatus from a center of the plasma processing apparatus, diameters of the gas discharging holes may become larger. From the above structure, a discharging speed of the gas may be maintained constantly, and at the same time, the flow amount of the gas at a portion that is far from the center of the plasma processing apparatus may be greater than the flow amount of the gas at a portion that is close to the center of the plasma processing apparatus.

Each of the plurality of throttle portions may be a tubule having the substantially same inner diameter. The conductance may be adjusted by controlling a length of the throttle while the inner diameter of the throttle portion is maintained constantly.

Each of the plurality of throttle portions may be a tubule having the substantially same inner diameter.

According to another aspect of the present invention, there is provided a plasma processing apparatus including: a processing container which is formed of metal and receives a substrate that is plasma-processed; an electromagnetic wave source which supplies electromagnetic waves required to excite the plasma to inside of the processing container; one, two, or more dielectric plates which are disposed on a lower surface of a lid of the processing container, are partially exposed to inside of the processing container, and transmit the electromagnetic wave supplied from the electromagnetic wave source to inside of the processing container; and a surface wave propagating unit which propagates the electromagnetic wave along a metal surface exposed to inside of the processing container and is provided adjacent to the dielectric plate, wherein the plasma processing apparatus includes: a gas supply source which supplies a desired gas; and a plurality of gas discharging holes which discharge the gas supplied from the gas supply source to inside of the processing container.

According to this invention, the electromagnetic wave may be propagated along a metal surface exposed inside the processing container. Accordingly, the gas discharged from the plurality of gas discharging holes may be dissociated uniformly, and plasma may be generated with high uniformity.

The plasma processing apparatus may further include a metal electrode that is adjacent to the dielectric plate, and the plurality of gas discharging holes may include a plurality of first gas discharging holes formed in the metal electrode, and the gas is introduced into the processing container from the plurality of first gas discharging holes.

The plasma processing apparatus may further include a metal cover that is disposed to be adjacent to the dielectric plate on the lower surface of the lid of the processing container, on which the dielectric plate is not disposed, and the plurality of gas discharging holes may include a plurality of second gas discharging holes formed in the metal cover, and the gas is introduced into the processing container from the plurality of second gas discharging holes in the metal cover.

The plasma processing apparatus may further include a side cover that is adjacent to the dielectric plate and disposed on an outer portion of the dielectric plate on the lower surface of the lid of the processing container, on which the dielectric plate is not disposed, and the plurality of gas discharging holes may include a plurality of second gas discharging holes formed in the side cover, and the gas is introduced into the processing container from the plurality of second gas discharging holes in the side cover.

Since the plurality of gas discharging holes are formed in the metal electrode, the metal cover, and the side cover, etching of the dielectric plate and adhesion of the reaction products to the inner wall of the processing container may be suppressed which were conventionally generated, and thereby reducing contamination or particles. In addition, it is easy to process the apparatus, and expenses may be reduced greatly.

A first gas passage may be formed inside the metal electrode, and the gas may be introduced into the processing container from the plurality of first gas discharging holes through the first gas passage.

A first gas passage may be formed between the metal electrode and the dielectric plate, and the gas may be introduced into the processing container from the plurality of first gas discharging holes through the first gas passage.

The first gas passage may be a groove formed on at least one of a surface of the metal electrode, which is adjacent to the dielectric plate, and a surface of the dielectric plate, which is adjacent to the metal electrode.

A second gas passage may be formed in at least one of the metal cover and the side cover, and the gas may be introduced into the processing container from the plurality of second gas discharging holes through the second gas passage.

A second gas passage may be formed between at least one of the metal cover and the side cover and the lid, and the gas may be introduced into the processing container from the plurality of second gas discharging holes through the second gas passage.

The second gas passage may be a groove formed in at least one of surfaces of the metal cover and the side cover, which are adjacent to the lid, or a surface of the lid, which is adjacent to the metal cover and the side cover.

The groove may have a depth of 0.2 mm or less. By using the depth of the groove in which a mean free path of electrons is considered, the electrons may actively collide with a wall of the gas passages so as to prevent an abnormal discharge generating in the gas passage.

The dielectric plate and the metal electrode may be fixed on the lid by using a screw, the metal cover and the side cover may be fixed on a main body of the lid by using a screw, and the first and second gas passages may be connected to third gas passages or fifth gas passages formed in inner portions or side surfaces of the screws.

The first gas discharging holes and the second gas discharging holes formed in at least one of the metal cover and the side cover may be arranged substantially at regular pitches.

A plurality of branch gas passages may be formed in the screws that fix the dielectric plate and the metal electrode on the lid, the third gas passages may be formed in the plurality of screws, the plurality of gas discharging holes may include a plurality of third gas discharging holes formed in the plurality of screws, and the gas may be introduced into the processing container from the plurality of third gas discharging holes through the third gas passages.

The gas conductance of the plurality of third gas discharging holes may be smaller than the gas conductance of the third gas passages.

The third gas discharging hole may be formed as a cylinder, and diameters and lengths of the first, second, and third gas discharging holes may be substantially the same as each other.

The first gas discharging holes and the second gas discharging holes may be arranged at substantially regular pitches.

The first gas discharging holes, the second gas discharging holes, and the third gas discharging holes are arranged at substantially regular pitches.

At least any of the first gas discharging holes, the second gas discharging holes, and the third gas discharging holes may be formed on a convex portion that is formed on a metal surface of at least one of the metal electrode, the metal cover, and the side cover.

A fourth gas passage may be formed on an inner side surface of the screw, and the gas that has passed through the third gas passage may be introduced into the first or second gas passage through the fourth gas passage.

The gas conductances of the first gas passage, the second gas passage, and the third gas passage may be greater than the gas conductance of the fourth gas passage.

The gas conductance of the third gas discharging hole may be the substantially same as the gas conductance of the fourth gas passage.

The fourth gas passage and the third gas discharging hole may be formed as cylinders, and diameter and length of the fourth gas passage may be the substantially same as the diameter and length of the third gas discharging hole.

A fifth gas passage may be formed between the screw and the lid, and the gas may be introduced into the plurality of first gas discharging holes and the plurality of second gas discharging holes from the first and second gas passages through the fifth gas passage.

A sixth gas passage that introduces the gas that has passed through the main gas passage to the fifth gas passage may be formed.

The sixth gas passage may be disposed so as to be inclined toward the object to be processed.

The throttle portion may be disposed to be adjacent to the main gas passage so that the gas conductance of the sixth gas passage is smaller than the gas conductance of the main gas passage.

The throttle portion may be disposed to be adjacent to the main gas passage so that the gas conductance of the third gas passage is smaller than the gas conductance of the main gas passage.

The plurality of gas discharging holes may include a plurality of fifth gas discharging holes formed in the lid that is exposed to inside of the processing container, and the gas may be introduced into the processing container from the plurality of fifth gas discharging holes.

The metal electrode may be provided on each surface of the dielectric plates that face the processing container, the plurality of gas discharging holes may include a plurality of first gas discharging holes formed in the metal electrode, and the gas may be introduced into the processing container from the plurality of fifth gas discharging holes and the first gas discharging holes.

A seventh gas passage may be formed inside the lid, and the gas may be introduced into the processing container from the fifth gas discharging holes through the seventh gas passage.

The first gas discharging hole and the fifth gas discharging hole may be formed as cylinders, and diameters and lengths of the first and fifth gas discharging holes may be the substantially same as each other.

The gas conductance of the fifth gas discharging hole and the gas conductance of the third gas discharging hole may be the substantially same as each other.

The plurality of third gas discharging holes may have the substantially same size as the fifth gas discharging hole.

The main gas passage may be formed inside the lid, and a plurality of main gas passages may distribute the gas into the plurality of branch gas passages.

The lid may include an upper lid and a lower lid, and the main gas passage may be formed on a boundary between the upper lid and the lower lid.

The plasma processing apparatus may include a gas discharging unit which is disposed between a space beneath the lid and a space for receiving the substrate in the inner space of the processing container, and discharges a gas supplied from a gas supply source that is different from the gas supply source toward the space for receiving the substrate.

The plasma processing apparatus may further include a lower gas discharging member that is connected to a plurality of branch gas passages and disposed in a space between the lid and the object to be processed, and the gas may be transferred from the plurality of branch gas passages, which are narrowed by the throttle portions, into the lower gas discharging member and introduced into the processing container from the lower gas discharging member.

According to another aspect of the present invention, there is provided a plasma processing apparatus including: a processing container which is formed of metal and receives a substrate that is plasma-processed; an electromagnetic wave source which supplies electromagnetic waves required to excite the plasma in the processing container; one, two, or more dielectric plates which are disposed on a lower surface of a lid of the processing container, are partially exposed to inside of the processing container, and transmit the electromagnetic wave supplied from the electromagnetic wave source to inside of the processing container; and a surface wave propagating unit which propagates the electromagnetic wave along a metal surface exposed to inside of the processing container, and disposed adjacent to the dielectric plates, wherein the plasma processing apparatus includes: a first gas supply source which supplies a first gas including a plasma excitation gas; a second gas supply source which supplies a desired second gas; a first gas discharging unit which discharges the first gas supplied from the first gas supply source into a first space that is an inner space of the processing container, which is adjacent to the lower surface of the lid; and a second gas discharging unit which discharges the second gas supplied from the second gas supply source into a second space that is an inner space of the processing container formed between the first space and a space for receiving the substrate.

The second gas discharging unit may include a plurality of gas passages passing through the inside of the lid and extending to near the second space, and at least one gas discharging hole formed in each of the gas passages to discharge the second gas into the second space.

The second gas discharging unit may be formed of a porous material.

The second gas discharging unit may be a slit-shaped opening.

The plurality of gas passages may include a first gas pipe disposed substantially perpendicularly to the object to be processed, and a plurality of second gas pipes that are connected to the first gas pipe in substantially with the object to be processed.

The plurality of second gas pipes may be disposed at regular angle intervals around the first gas pipe.

A plurality of first gas pipes may be arranged at regular pitches, and four second gas pipes may be connected to each of the first gas pipes.

The plurality of gas discharging holes may be formed at regular pitches in a surface of the plurality of second pipes, which faces the object to be processed.

The plurality of gas passages may include third gas pipes that are disposed at a predetermined angle with respect to the object to be processed.

The third gas pipes extend from a plurality of portions on the lower surface of the lid to near the second space and, on each of the plurality of portions, a plurality of third gas pipes are formed in different directions to each other at substantially regular angle intervals.

The gas discharging holes may be formed on end portions of the plurality of third gas pipes, and the gas discharging holes may be arranged at substantially regular pitches on a same plane that is parallel with the object to be processed.

According to another aspect of the present invention, there is provided a plasma processing apparatus for plasma-processing an object to be processed by exciting a gas, the plasma processing apparatus including: a processing container; a gas supply source which supplies a desired gas; a main gas passage through which the gas supplied from the gas supply source flows; a plurality of branch gas passages which are connected to a lower stream side of the main gas passage; a plurality of throttle portions which form on the plurality of branch gas passages and narrow the branch gas passages; and a plurality of lower gas discharging members which are fixed on the plurality of branch gas passages to be disposed between a lid and the object to be processed in the processing container, include one, two, or more gas discharging units in each of the branch gas passages, and discharge the gas that has passed through the plurality of branch gas passages into a space between the lid and the object to be processed.

According to this invention, a ratio between gas conductances of the main gas passage and the plurality of branch gas passages may be increased by the throttle portions. Consequently, the gas may be uniformly supplied to the processing chamber, and there is no need to narrow the gas discharging holes in consideration of the gas conductance, and accordingly, the flow rate of the gas may be reduced to be introduced as a laminar flow. Therefore, density of the gas in the processing chamber may be uniform to generate the plasma uniformly.

The plurality of lower gas discharging members may be fixed on a plurality of screws, in which the branch gas passages are formed, or integrally formed with the branch gas passages.

The gas discharging units of the plurality of lower gas discharging members may be formed of a porous material.

The gas discharging units of the plurality of lower gas discharging members may be slit-shaped openings.

The plurality of lower gas discharging members may include a first gas pipe disposed substantially perpendicularly to the object to be processed, and a plurality of second gas pipes that are connected to the first gas pipe in substantially parallel with the object to be processed.

The plurality of second gas pipes may be arranged at regular angle intervals around the first gas pipe.

A plurality of first gas pipes may be arranged at regular pitches, and four second gas pipes may be connected to each of the first gas pipes.

A plurality of fourth gas discharging holes may be formed at regular pitches in surfaces of the plurality of second pipes, which face the object to be processed.

Each of the plurality of lower gas discharging members may include one, two, or more third gas pipes, and the gas may be introduced into the processing container from the plurality of fourth gas discharging holes formed in the third gas pipes.

The plurality of lower gas discharging members may include the plurality of third gas pipes, and the plurality of third gas pipes may be fixed in a plurality of screws, in which the branch gas passages are formed, and arranged at substantially regular angle intervals around the plurality of screws.

Four third gas pipes may be connected to each of the plurality of screws, and end portions of the four third gas pipes may be arranged at regular pitches on a same plane that is in parallel with the object to be processed.

According to another aspect of the present invention, there is provided a plasma processing method including: supplying a desired gas from a gas supply source; passing the supplied gas through a main gas passage; flowing the gas that has passed through the main gas passage into an apparatus; discharging the gas that has passed through a plurality of throttle portions that are formed in a plurality of branch gas passages connected to a lower stream side of the main gas stream for narrowing the plurality of branch gas passages, to inside of a processing container through one, two, or more gas discharging holes that are formed on each of the plurality of branch gas passages; and plasmatizing the discharged gas to perform the plasma-process of an object to be processed in the processing container.

According to another aspect of the present invention, there is provided a plasma processing method for plasma-processing an object to be processed using a plasma processing apparatus, which includes a processing container which is formed of metal and receives a substrate to be plasma-processed; an electromagnetic wave source which supplies electromagnetic waves required to excite the plasma in the processing container; one, two, or more dielectric plates which are disposed on a lower surface of a lid of the processing container, are partially exposed to inside of the processing container, and transmit the electromagnetic wave supplied from the electromagnetic wave source to inside of the processing container; and a surface wave propagating unit which propagates the electromagnetic wave along a metal surface exposed to inside of the processing container, and is disposed adjacent to the dielectric plates, the method includes: supplying a desired gas from a gas supply source; discharging the supplied gas into the processing container from a plurality of gas discharging holes, the plurality of gas discharging holes include a plurality of fifth gas discharging holes formed in the lid, wherein the gas discharged into the processing container is excited by the electromagnetic wave introduced into the processing container to perform the plasma-process of the object to be processed.

According to another aspect of the present invention, there is provided a plasma processing method including: supplying a desired gas from a gas supply source; passing the supplied gas through a main gas passage; flowing the gas that has passed through the main gas passage into a plurality of branch gas passages that are connected to a lower stream side of the main gas passage; discharging the gas that has passed through a plurality of throttle portions that are formed in a plurality of branch gas passages for narrowing the plurality of branch gas passages, to inside of a processing container through one, two, or more gas discharging holes per each of the plurality of branch gas passages, which are formed on a plurality of lower gas discharging members that are fixed on the plurality of branch gas passages to be disposed in a space between the lid and the object to be processed in the processing container; and plasmatizing the discharged gas to perform the plasma-process of the object to be processed in the processing container.

According to another aspect of the present invention, there is provided a plasma processing apparatus including: a processing container which is formed of metal and receives a substrate to be plasma-processed; an electromagnetic wave source which supplies electromagnetic waves required to excite the plasma to inside of the processing container; one, two, or more dielectric plates which are disposed on a lower surface of a lid of the processing container, are partially exposed to inside of the processing container, and transmit the electromagnetic wave supplied from the electromagnetic wave source to inside of the processing; and a surface wave propagating unit which propagates the electromagnetic wave along a metal surface exposed to inside of the processing container and is disposed adjacent to the dielectric plates, wherein the plasma processing apparatus further includes: a gas supply source which supplies a desired gas; and a plurality of gas discharging holes which discharge the gas supplied from the gas supply source to inside of the processing container, wherein the plurality of gas discharging holes include a plurality of first gas discharging holes formed in the lid.

A metal electrode may be formed on each surface of the dielectric plates that face the processing container, the plurality of gas discharging holes may include a plurality of second gas discharging holes formed in the metal electrode, and the gas may be introduced into the processing container from the plurality of first and second gas discharging holes.

A first gas passage may be formed inside the lid, and the gas may be introduced into the processing container from the first gas discharging holes after passing through the first gas passage.

A second gas passage may be formed between the metal electrode and the dielectric plate, and the gas may be introduced into the processing container from the plurality of second gas discharging holes through the second gas passage.

The second gas passage may be a groove formed on at least one of a surface of the metal electrode, which is adjacent to the dielectric plate, and a surface of the dielectric plate, which is adjacent to the metal electrode.

The lid may include a metal cover and a side cover that are disposed on portions where the dielectric plates are not disposed, and the plurality of first gas discharging holes may be formed in the metal cover and the side cover.

A third gas passage that is connected to the first gas passage may be formed inside the metal cover and the side cover or between the metal cover and the side cover, and the lid, and the gas may be introduced into the processing container from the plurality of first gas discharging holes through the third gas passage.

The third gas passage may be a groove formed on at least one of the surfaces of the metal cover and the side cover, which are adjacent to the lid, and the surface of the lid, which is adjacent to the metal cover and the side cover.

The groove may have a depth of 0.2 mm or less.

The dielectric plate and the metal electrode may be attached to the lid by using a first screw, the metal cover and the side cover may be attached to a main body of the lid by using a second screw, and the second and third gas passages may be connected to the first gas passage through gas passages formed in inner spaces of the first and second screws or on side surfaces of the first and second screws.

The first and second gas discharging holes may be arranged at substantially regular pitches.

The plasma processing apparatus may include a gas discharging unit which is disposed between a space beneath the lid and a space for receiving the substrate in the inner space of the processing container and discharges a gas supplied from a gas supply source that is different from the gas supply source toward the space for receiving the substrate.

Advantageous Effects

As described above, according to the present invention, a ratio between gas conductance of a main gas passage and gas conductance of a plurality of branch gas passages may be increased.

BEST MODE FOR CARRYING OUT THE INVENTION

Figure 1:
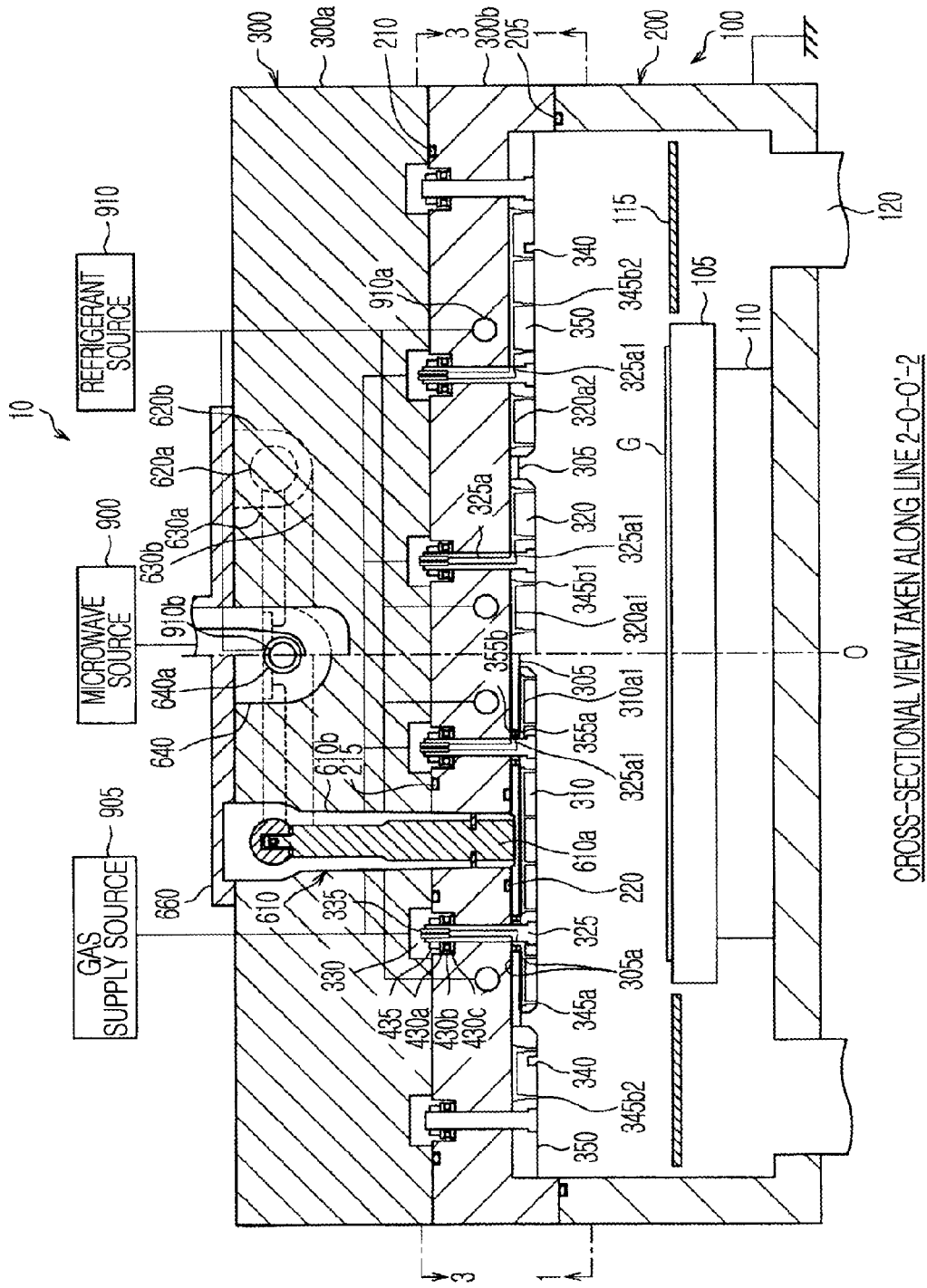
FIG. 1 is a longitudinal-sectional view of a microwave plasma processing apparatus according to an embodiment 1 of the present invention.

Hereinafter, the present invention will be described in detail by explaining exemplary embodiments of the invention with reference to the attached drawings. Like reference numerals in the drawings denote like elements, and overlapping descriptions thereof will be omitted.

Embodiment 1

Figure 2:
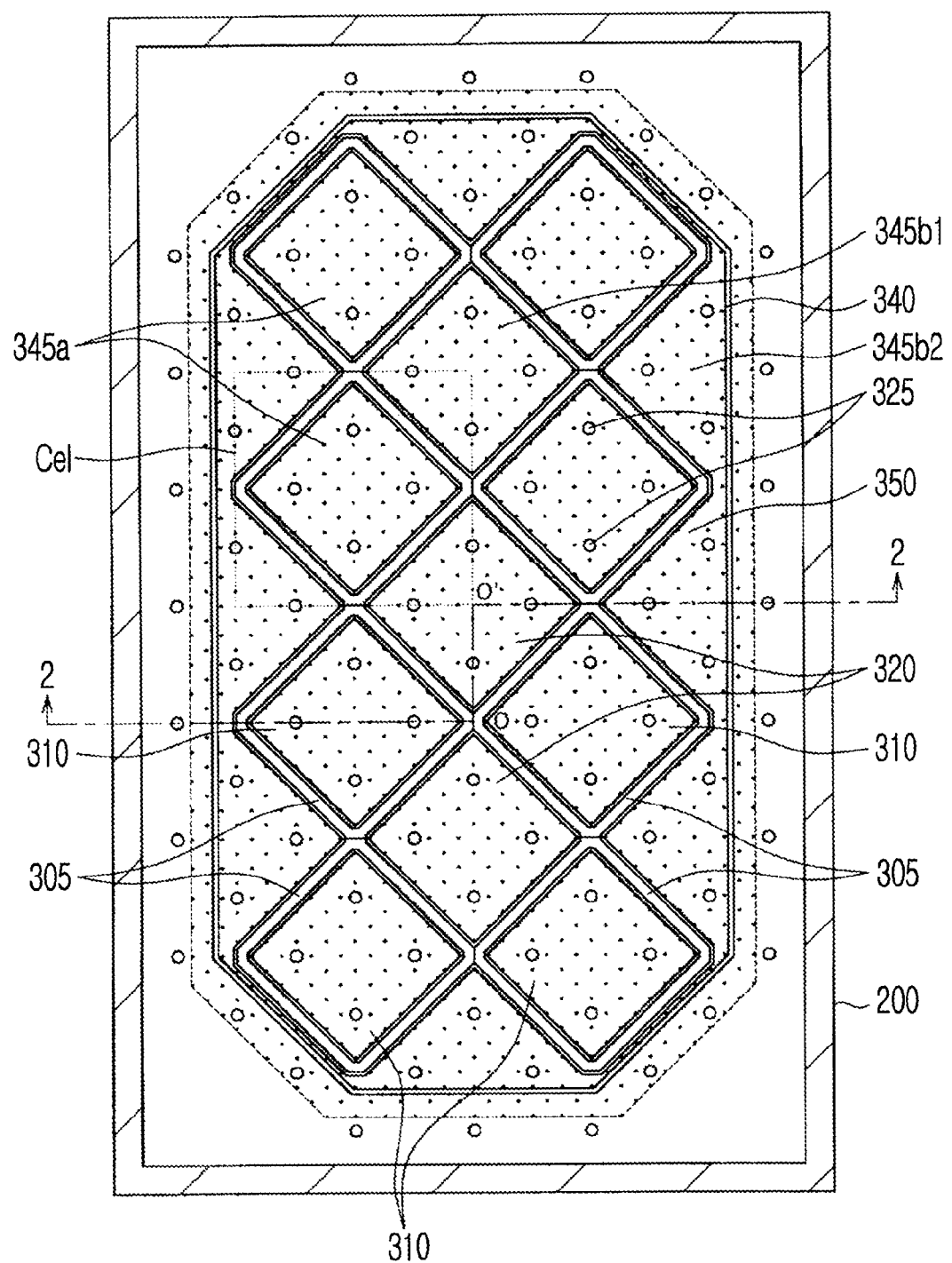
FIG. 2 is a cross-sectional view taken along a line 1-1 of FIG. 1.

A structure of a microwave plasma processing apparatus 10 according to an embodiment 1 of the present invention will now be described with reference to FIG. 1. FIG. 1 schematically shows a longitudinal-sectional view of the microwave plasma processing apparatus 10 according to the present embodiment. FIG. 1 is a cross-sectional view taken along a line 2-O-O'-2 of FIG. 2. FIG. 2 shows a ceiling surface of the microwave plasma processing apparatus 10, and is cross-sectional view taken along a line 1-1 of FIG. 1. According to the embodiment 1, an upper gas shower plate is formed on the ceiling surface.

(Outline of Microwave Plasma Processing Apparatus)

As shown in FIG. 1, the microwave plasma processing apparatus 10 includes a processing container 100 for plasma-processing a glass substrate (hereinafter, referred to as a substrate G). The processing container 100 includes a container body 200 and a lid 300. The container body 200 has a cube shape having an open top and a closed bottom, wherein the open top is closed by the lid 300. The lid 300 is formed of an upper lid 300a and a lower lid 300b. An O-ring 205 is disposed on a contacting surface between the container body 200 and the lower lid 300b, and accordingly, the container body 200 and the lower lid 300b are sealed, thereby defining a processing chamber. An O-ring 210 and an O-ring 215 are also disposed on a contacting surface between the upper lid 300a and the lower lid 300b, and accordingly, the upper lid 300a and the lower lid 300b are sealed. The container body 200 and the lid 300 are formed of metal, for example, such as an aluminum alloy, or the like, and are electrically grounded.

A susceptor 105 (stage) on which the substrate G is placed is provided inside the processing container 100. The susceptor 105 is formed of, for example, aluminum nitride. The susceptor 105 is supported by a supporter 110, and a baffle plate 115 for controlling a flow of a gas of the processing chamber in a desirable state is provided around the susceptor 105. A gas exhaust pipe 120 is provided at a bottom part of the processing container 100, and a gas inside the processing container 100 is exhausted by using a vacuum pump (not shown) provided outside the processing container 100.

Referring to FIGS. 1 and 2, dielectric plates 305, metal electrodes 310, and metal covers 320 are regularly disposed on the ceiling surface of the processing container 100. Side covers 350 are disposed around the metal electrodes 310 and the metal covers 320. The dielectric plate 305, the metal electrode 310, and the metal cover 320 are each a plate having a rough square shape in which corners are slightly cut. Alternatively, the dielectric plate 305, the metal electrode 310, and the metal cover 320 may each have a diamond shape. The metal electrode 310 is a flat plate and is provided adjacent to the dielectric plate 305 so that the dielectric plate 305 is substantially uniformly exposed from an outer edge portion of the metal electrode 310. Accordingly, the dielectric plate 305 is sandwiched by an inner wall of the lid 300 and the metal electrode 310. The metal electrode 310 is electrically connected to an inner wall of the processing container 100.

8 dielectric plates 305 and 8 metal electrodes 310 are disposed at regular pitches at a location inclining about 45° with respect to the substrate G or the processing container 100. Here, a pitch is determined in such a way that a diagonal length of one dielectric plate 305 is about 0.9 times or above a distance between centers of neighboring dielectric plates 305. Accordingly, the slightly cut corners of the dielectric plates 305 are adjacently disposed.

Regarding the metal electrode 310 and the metal cover 320, the metal cover 320 is thicker, as much as a thickness of the dielectric plate 305. According to this structure, heights of the ceiling surface are almost similar, and at the same time, an exposed portion of the dielectric plate 305 or dented shapes near the dielectric plate 305 all have almost the same pattern.

The dielectric plate 305 is formed of alumina, and the metal electrode 310, the metal cover 320, and the side cover 350 are formed of an aluminum alloy. Also, in the present embodiment, the 8 dielectric plates 305 and the 8 metal electrodes 310 are disposed in 2 rows and 4 columns, but numbers of the dielectric plates 305 and metal electrodes 310 are not limited thereto, and may be increased or reduced.

The dielectric plate 305 and the metal electrode 310 are evenly supported by screws 325 from four locations (refer to FIG. 2). The metal cover 320 and the side cover 350 are also attached to a main body part of the lid 300 by the screws 325. As shown in FIG. 1, a main gas passage 330 having a lattice shape in a direction perpendicular to the ground is formed between the upper lid 300a and the lower lid 300b. The main gas passage 330 distributes the gas to third gas passages 325a formed in the plurality of screws 325. A tubule 335 for narrowing a passage is inserted into an inlet of the third gas passage 325a. The tubule 335 is formed of ceramic or metal. A first gas passage 310a is formed between the metal electrode 310 and the dielectric plate 305. Second gas passages 320a1 and 320a2 are also formed between the metal cover 320 and the dielectric plate 305 and between the side cover 350 and the dielectric plate 305. A front end surface of the screw 325 forms same surface as bottom surfaces of the metal electrode 310, metal cover 320, and side cover 250, so as not to scatter distribution of plasma. First gas discharging holes 345a opened on the metal electrode 310 and second gas discharging holes 345b1 and 345b2 opened on the metal cover 320 and the side cover 350 are formed at regular pitches.

A gas output from a gas supply source 905 passes from the main gas passage 330 to the third gas passage 325a (branch gas passage), passes through the first gas passage 310a in the metal electrode 310 and the second gas passages 320a1 and 320a2 in the metal cover 320 and the side cover 350, and is supplied from the first gas discharging hole 345a and the second gas discharging holes 345b1 and 345b2 into the processing chamber. An O-ring 220 is disposed on a contacting surface between the lower lid 300b and the dielectric plate 305 near an outer diameter of a first coaxial waveguide 610, and thus the air inside the first coaxial waveguide 610 does not enter an inner side of the processing container 100.

As such, by forming a gas shower plate on a metal surface of a ceiling unit, etching of a dielectric plate surface due to ions in plasma, and adhesion of reaction products to an inner wall of a processing container, which were conventionally generated, are suppressed, thereby promoting reduction of contamination or particles. Also, unlike a dielectric substance, metal is easily processed, and thus expenses may be remarkably reduced.

An inner conductor 610a is inserted into an outer conductor 610b of the first coaxial waveguide 610 formed by excavating the lid 300. Inner conductors 620a through 640a of second through fourth coaxial waveguides are respectively inserted into outer conductors 620b through 640b of the second through fourth coaxial waveguides that are formed by excavating the lid 300, and top of the lid are covered by a lid cover 660. The inner conductors 610a through 640a are formed of copper having good thermal conductivity.

The surface of the dielectric plate 305 shown in FIG. 1 is coated with a metal film 305a except an area where a microwave is incident on the dielectric plate 305 from the first coaxial waveguide 610 and an area where the microwave is emitted from the dielectric plate 305. Accordingly, propagation of the microwave is not scattered even by a gap generated between the dielectric plate 305 and an element near the dielectric plate 305, and thus the microwave may be stably introduced into the processing container 100.

As shown in FIG. 2, the dielectric plate 305 is exposed from between the metal electrode 310 adjacent to the dielectric plate 305 in one-to-one correspondence, and the inner wall (including the inner wall of the processing container 100 covered by the metal cover 320) of the processing container 100 where the dielectric plate 305 is not disposed. A shape of the dielectric plate 305 and a shape of the inner wall (including the inner wall of the processing container 100 covered by the metal cover 320) of the processing container 100 where the dielectric plate 305 is not disposed are substantially similar or symmetrical to each other. Accordingly, power of the microwave may be substantially uniformly supplied from the dielectric plate 305 to the metal electrode side and the inner wall side (or metal cover 320 and side cover 350 sides) by a surface wave propagating unit that propagates electromagnetic waves along the metal surface exposed to inside of the processing container 100.

As a result, the microwave emitted from the dielectric plate 305 becomes a surface wave to distribute power into halves while propagating surfaces of the metal electrode 310, metal cover 320, and side cover 350. A surface wave propagating between a metal surface of an inner surface of the processing container 100 and plasma will now be referred to as a conductor surface wave (a metal surface wave). Accordingly, by propagating the entire ceiling surface using the conductor surface wave, plasma is uniformly and stably generated below the ceiling surface of the microwave plasma processing apparatus 10 according to the present embodiment.

In the side cover 350, a groove 340 having an octagonal shape is formed to surround the entire 8 dielectric plates 305, and thus the conductor surface wave propagating the ceiling surface is suppressed from propagating an outer side of the groove 340. A plurality of grooves 340 may be multiply formed in parallel.

An area having a center point of the adjacent metal cover 320 around one metal electrode 310 as a peak will now be referred to as a cell Ce1 (refer to FIG. 2). In the ceiling surface, one cell Ce1 is used as one unit, and 8 cells Ce1 are regularly arranged, wherein the 8 cells Ce1 have the same pattern.

A refrigerant supply source 910 is connected to a refrigerant pipe 910a inside the lid 300, and a refrigerant supplied from the refrigerant supply source 910 circulates inside the refrigerant pipe 910a in the lid 300 and returns to the refrigerant supply source 910 to maintain a temperature of the processing container 100 at a desired level. In the inner conductor 640a of the fourth coaxial waveguide, a refrigerant pipe 910b penetrates through the inside of the inner conductor in a length direction. By passing the refrigerant through the refrigerant pipe 910b, heating of the inner conductor 640a is suppressed.

(Upper Gas Shower Plate)

Figure 3:
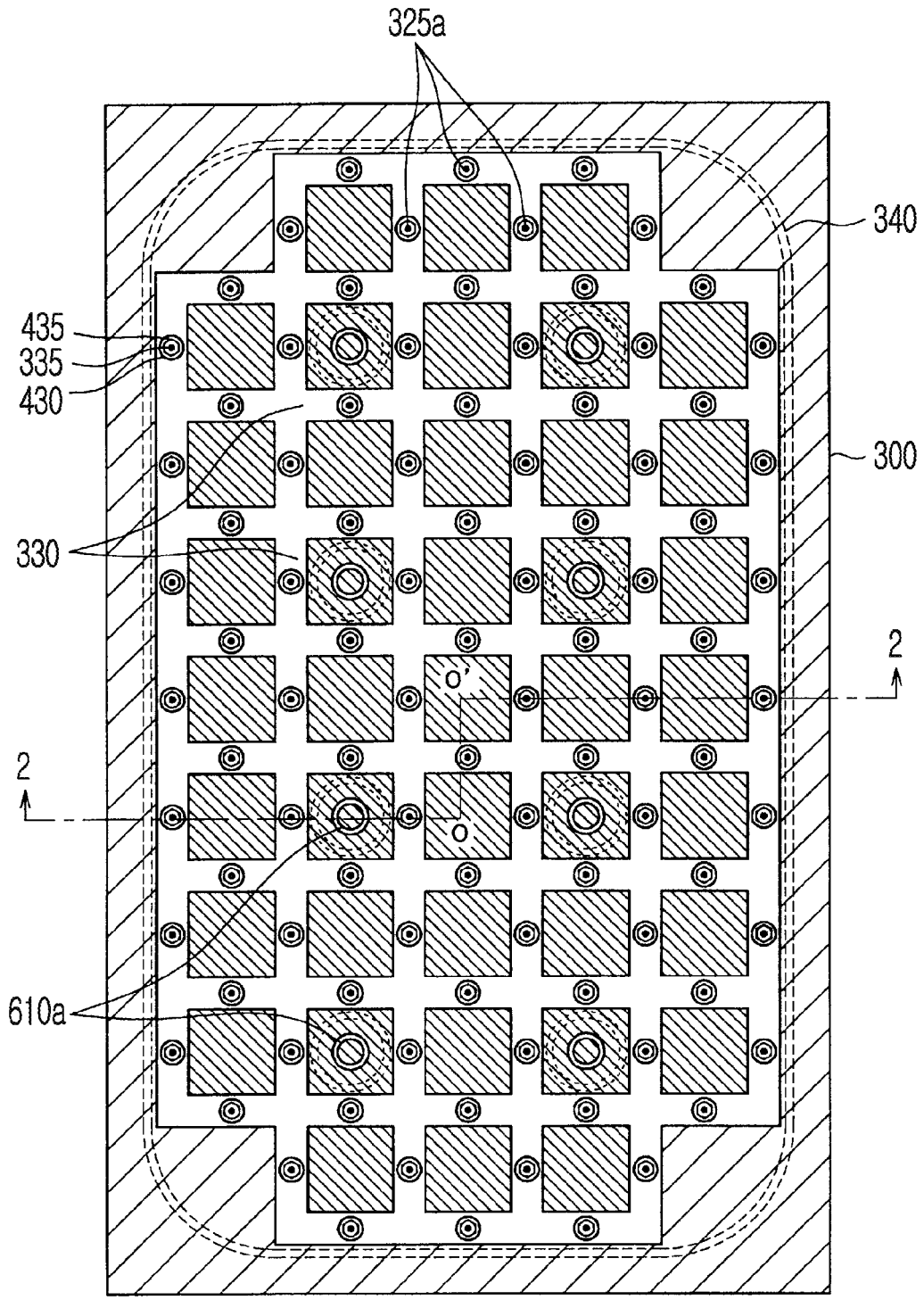
FIG. 3 is a cross-sectional view taken along a line 3-3 of FIG. 1.

Next, the upper gas shower plate will be described with reference to FIGS. 1 and 3. FIG. 3 is a cross-sectional view taken along a line 3-3 of FIG. 1.

(Gas Passage)

The gas supplied from the gas supply source 905 flows to the main gas passage 330. The main gas passage 330 is formed by using a space between the upper lid 300a and the lower lid 300b. That is, the main gas passage 330 is formed in substantially parallel with the substrate G, and in front-and-back direction of the paper surface of FIG. 1. Accordingly, a surface of the boundary between the upper lid 300a and the lower lid 300b becomes the gas passage of lattice shape.

The main gas passage 330 distributes the gas into gas passages formed in the plurality of screws 325 (hereinafter, referred to as third gas passage 325a), which are parts of the branch gas passages. The tubule 335 for narrowing a passage is inserted to an inlet of the third gas passage 325a. The tubule 335 is formed of ceramic or metal.

The third gas passage 325a is communicated with a horizontal hole (referred to as a fourth gas passage 325a1) formed on a side surface of the screw 325. The gas passing through the fourth gas passage 325a1 passes a gap between a wave washer 335a and a spacer 335b, and the screw 325, and then, is introduced into a gap (referred to as the first gas passage 310a) formed between the metal electrode 310 and the dielectric plate 305. The first gas passage 310a is formed by excavating an upper surface of the metal electrode 310. A plurality of first gas discharging holes 345a are formed at regular pitches in a lower surface of the metal electrode 310. The gas introduced into the first gas passage 310a is discharged to inside of the processing container 100 from the plurality of first gas discharging holes 345a.

Gas passages of the metal cover 320 and the side cover 350 are also the same as those of the metal electrode 310. That is, the gas passing through the fourth gas passage 325a1 is introduced into a gap formed between the metal cover 320 and the dielectric plate 305, and a gap formed between the side cover 350 and the dielectric plate 305 (second gas passages 320a1 and 320a2). A plurality of second gas discharging holes 345b1 and 345b2 are formed at regular pitches in lower surfaces of the metal cover 320 and the side cover 350. The gas introduced into the second gas passages 320a1 and 320a2 is discharged to inside of the processing container 100 from the plurality of second gas discharging holes 345b1 and 345b2. As described above, when it is assumed that the gas supply source 905 is an upper stream, the plurality of branch gas passages are connected to a lower stream side of the main gas passage 330, and the plurality of first gas discharging holes 345a and second gas discharging holes 345b1 and 345b2 are formed on lower streams of the plurality of branch gas passages.

The metal cover 320 is thicker as much as the thickness of the dielectric plate 305 than the metal electrode 310. Thus, when depths of the first gas passage 310a and the second gas passages 320a1 and 320a2 are the same to each other, lengths of the second gas discharging holes 345b1 and 345b2 are longer than a length of the first gas discharging hole 345a. To make gas conductance of the first gas discharging hole 345a and gas conductance of the second gas discharging holes 345b1 and 345b2 nearly same as each other, the second gas discharging holes 345b1 and 345b2 have thick upper portions and narrow lower portions. Thickness and length of the narrow lower portions of the second gas discharging holes 345b1 and 345b2 are the same as thickness and length of the first gas discharging hole 345a.

(No Gap)

It is preferable that there is no gap between the dielectric plate 305 and the lid 300, or between the dielectric plate 305 and the metal electrode 310. If there is a gap that is not controllable, wavelength of the microwave propagating the dielectric plate 305 becomes unstable, and thus, uniformity of the plasma or load impedance observed from the coaxial waveguide may be affected. In addition, if there is a large gap (equal to or greater than 0.2 mm), discharge may be caused at the gap. Thus, the dielectric plate 305 and the lower lid 300b, and the dielectric plate 305 and the metal electrode 310 are configured to be closely attached to each other when nuts 435 are fastened.

Accordingly, the wave washer 355a and the spacer 355b are disposed on up and down between the lid 300 and the metal electrode 310. The wave washer 355a is formed of metal such as stainless steel (SUS) or an aluminum alloy. The spacer 355b is formed of metal such as an aluminum alloy. The wave washer 355a is formed between the lid 300 and the metal electrode 310 so that the lid 300 and the metal electrode 310 are firmly connected to each other electrically and thermally even when both surfaces of the dielectric plate 305 are attached to metal parts. In addition, the wave washer 355a may be elastic, for example, a disk spring, a spring washer, a metal spring, and the like.

(Prevention of Cracks)

When the nuts 435 are fastened with excessive torque, stress is applied to the dielectric plate 305 and the dielectric plate 305 may be cracked. Otherwise, even though there is no crack generation when fastening the nuts 435, stress may be applied to the dielectric plate 305 when temperature of each element rises due to the generation of plasma. Therefore, a wave washer 430b having an optimal spring force is inserted between the nut 435 and the lower lid 300b so that the metal electrode 310 may be fixed, at all time, with an appropriate force (force that is slightly greater than a force pushing the O-ring 220 for closely-attaching the dielectric plate 305 and the lower lid 300b to each other) by using the screw 325. When the nut 435 is fastened, the nut 435 is not completely fastened until the wave washer 430b becomes flat, but is fastened so that a deformation amount of the wave washer 430b is constant. In addition, the present embodiment is not limited to the wave washer 430b, and a disk spring, a spring washer, a metal spring, and the like having the elasticity may be used.

A washer 430a is disposed between the nut 435 and the wave washer 430b; however, the washer 430a may be omitted. In addition, a washer 430c is disposed between the wave washer 430b and the lower lid 300b. In general, since there is a gap between the screw 325 and the lid 300, and the gas in the main gas passage 330 flows to the first gas passage 310a through the gap. If the gas flow amount that is not controllable is large, the gas discharge from the first gas discharging hole 345a becomes nonuniform. Therefore, the gap between the washer 430c and the screw 325 is reduced and the washer 430c is formed thick in order to suppress the gas flow amount flowing out side of the screw 325.

Figure 5:
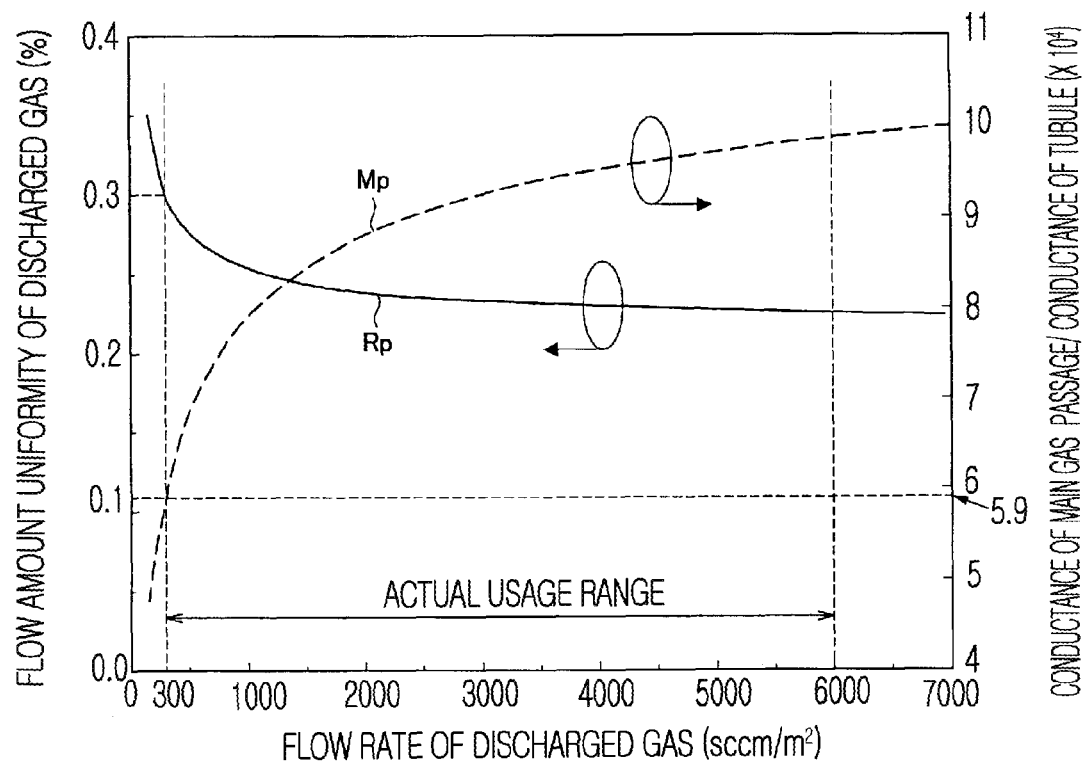
FIG. 5 is a graph showing a uniformity of a discharged gas flow amount and a conductance ratio with respect to the discharged gas flow amount.

FIG. 5 shows a result of calculating an in-plane uniformity of a flow amount of the gas discharged from the shower plate. A horizontal axis denotes a flow amount per unit area of the gas supplied into the processing container 100. A solid line Rp denotes a uniformity of the flow amount of the discharged gas, that is, a ratio between the flow amounts of discharged gas at both ends of the main gas passage 330 when the gas is introduced into an end of the main gas passage 330 from the gas supply source 905. A dashed line Mp denotes a ratio between gas conductances of the main gas passage 330 and the tubule 335.

Here, the main gas passage 330 has a width of 20 mm and a height of 6 mm, the tubule 335 has an inner diameter of 0.5 mm and a length of 12 mm, and the first gas discharging hole 345a has a diameter of 0.6 mm and a length of 5 mm. The flow amount of the discharged gas in actual plasma treatment may be set as 300 to 6000 sccm/m$^2$.

In FIG. 5, the ratio between the gas conductances of the main gas passage 330 and the tubule 335 increases as the flow amount of the discharged gas increases. This is because the gas conductance of a cylinder is in proportion to the cube of a diameter and irrelevant with a pressure in a molecular basin having low pressure, and in proportion to the fourth power of the diameter and the pressure on a viscose basin having high pressure.

If the flow amount of the discharged gas increases, the pressure in the gas passage increases. When the main gas passage 330 and the tubule 335 become the viscose basin, the gas conductances of both are in proportion to the pressure, and thus, the ratio of the gas conductances is constant with respect to the flow amount of the discharged gas. On the other hand, when the flow amount of the discharged gas is reduced, the tubule 335 having the smaller diameter than that of the main gas passage 330 first becomes the molecular basin, and thus, the gas conductance of the tubule 335 is not dependent onto the pressure, and the ratio of the gas conductances is reduced.

When the flow amount of the discharged gas is at the lowest level of the actual usage range shown in FIG. 5, that is, 300 sccm/m$^2$, the ratio between the gas conductances of the main gas passage 330 and the tubule 335 is 59000. At this time, the uniformity of the flow amount of the discharged gas is 0.3%, which is excellent. The uniformity is further improved with the increase of the flow amount of the discharged gas. This is because the ratio between the gas conductances of the main gas passage 330 and the tubule 335 increases.

64 first gas discharging holes 345a are formed in the metal electrode 310 in an 8×8 array. The gas discharging holes 345a are communicated with the first gas passage 310a. The gas after passing through four tubules 335 is introduced into the first gas passage 310a. Therefore, each of the tubules 335 supplies gas to 16 (which 64/4) first gas discharging holes 345a. The metal cover 320 also has the same number of gas discharging holes. Regarding the side cover 350, the number of gas discharging holes, to which the gas is supplied from each of the tubules 335, is different from those of the metal electrode 310 or the metal cover 320.

In the present embodiment, when it is assumed that the gas conductance of the tubule 335 is Cr and the number of gas discharging holes, to which the gas is supplied from each of the tubules 335, is N, values of Cr/N with respect to entire tubules 335 are the same as each other. That is, the gas is uniformly discharged from all of the gas discharging holes.

Accordingly, a uniform treatment with respect to the substrate G may be performed. In order to make the values of Cr/N consistent, the diameters and lengths of the tubules 335 with respect to the metal electrode 310 and the metal cover 320 are formed to be the same as each other so as to make the gas conductance of the tubules 335 consistent. With respect to the side cover 350, the diameters of the tubules 335 are consistent, and then, lengths of the tubules 335 are adjusted so that the gas conductance Cr may have a desired value.

The gas conductance of the tubule 335 is set to be smaller than a sum of the gas conductances of the 16 first gas discharging holes 345a, to which the gas is supplied from each of the tubules 335. Substantially, a value of (gas conductance of the tubule 335)/(sum of the gas conductances of the first gas discharging holes 345a) ranges from 1/36.4 to 1/14.5 with respect to the gas flow amount of 300 to 6000 sccm/m². At this time, a discharging flow rate of the gas discharged from the first gas discharging hole 345a is 90 m/s in maximum, which is much smaller than the sound velocity of 360 m/s.

In order to discharge the gas evenly throughout the entire surface of the substrate G, the gas conductance of the main gas passage 330 should be sufficiently greater than the gas conductance of the branch gas passage. In a general plasma processing apparatus, because the gas conductance of the branch gas passage is restrained to be small, the diameter of the gas discharging hole is small. However, according to the above method, it is technically difficult to form a plurality of holes having small diameters with very high accuracy. In addition, pitches between the gas discharging holes should be increased, the plasma treatment may be performed nonuniformly. Also, because the flow rate of the discharged gas reaches the sound velocity, the flow of gas in the processing container is scattered so that the treatment may not be performed well, and thereby depositing an unnecessary film in the processing container.

(Throttling)

In the present embodiment, a throttle portion (tubule 335) is formed on a part of the upper stream side of the branch gas passage, not the gas discharging hole, to restrict the conductance. That is, a function of discharging gas and a function of restricting the conductance are separated. As described above, the value of (gas conductance of the tubule 335)/(sum of the gas conductances of the first gas discharging holes 345a) is sufficiently less than 1 (equal to or less than 1/14.5), and thus, the conductance may be restricted efficiently only by the tubule 335. Accordingly, even when the conductance is slightly changed on the lower stream of the tubule 335, the uniformity may be maintained. In addition, the ratio between the gas conductances of the main gas passage 330 and the tubule 335 is set to be sufficiently greater than 1 (equal to or greater than 59000 in the present embodiment), and thus, high uniformity is obtained.

Since the throttle portion (tubule 335) is disposed on the upper stream side of the branch gas passage, the pressure in the gas passage located on the lower stream side is suppressed to be low. Consequently, the flow amount of gas that leaks from the gas passage located on the lower stream side into the processing container 100 through the gap, not through the gas discharging hole, is suppressed to be low, and thus, the gas may be discharged more uniformly.

In addition, in the conventional plasma processing apparatus, since an exposed area of the dielectric plate 305 disposed on the ceiling surface is large, electrons are drawn to the dielectric plate 305 due to an electric field during sheath. Thus, the surface of the dielectric plate 305 may be negatively biased and etched, or chemical reaction may be prompted on the surface of the dielectric plate 305 by assists of ion energy.

In particular, reaction products by a reducing process of hydrogen radicals may be deposited on the inner surface of the processing container, and thereby causing contamination or generating particles.

On the other hand, according to the upper gas shower plate of the present embodiment, the plurality of gas discharging holes are formed in the metal electrode 310 or the metal cover 320, and thus, etching of the surface of the dielectric plate 305 and deposition of the reaction products on the inner surface of the processing container may be suppressed, and thereby reducing the contamination and particles. In addition, the upper gas shower head is formed of metal, and thus, it is easily processed and the expenses may be sharply reduced.

The tubule 335 is an example of the throttle portion that is formed on a plurality of branch gas passages to narrow the gas passage in the branch gas passages. Other examples of the throttle portion may include a fine hole, an orifice, a valve body, and a porous member. The throttle portion may be formed on a location that is closer to the main gas passage 330 than the plurality of first gas discharging holes 234a and the second gas discharging holes 345b, for example, may be formed in the plurality of branch gas passages (screw 325) to be adjacent to the main gas passage 330 or between the main gas passage 330 and the plurality of branch gas passages.

In addition, the first gas passage 310a may be a groove formed on a surface of the dielectric plate 305, which is adjacent to the metal electrode 310. Likewise, the second gas passage 320a may be a groove formed on a surface of the lid 300, which is adjacent to the metal cover 320 or the side cover 350.

Modified Example of the Embodiment 1

Figure 4A:
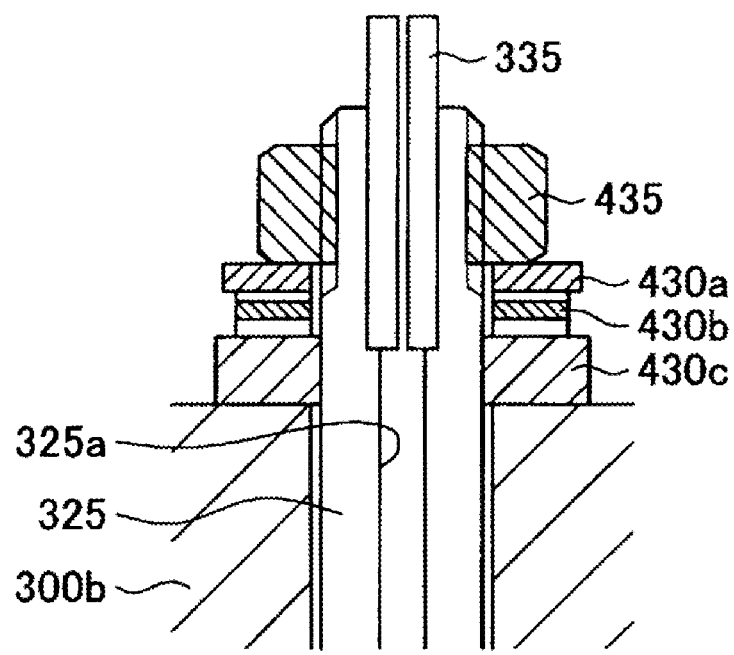
FIG. 4A is a diagram of an apparatus for preventing gas leakage from a periphery of a screw.
Figure 4B:
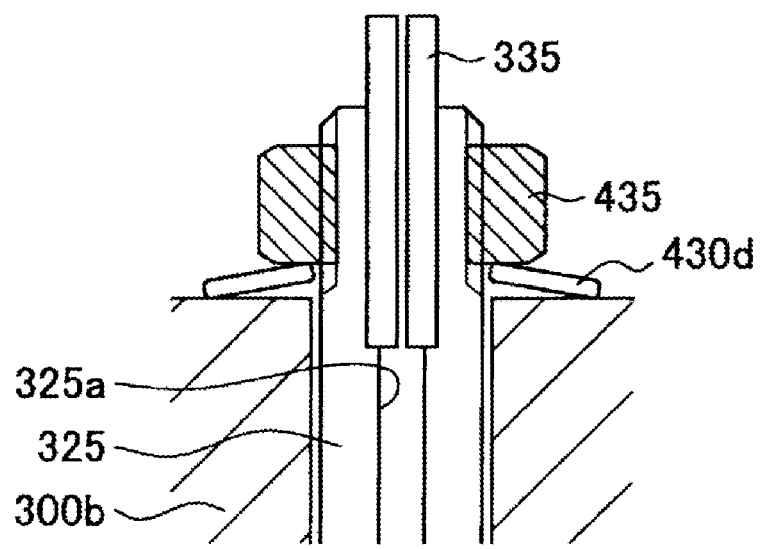
FIG. 4B is a diagram of an apparatus for preventing gas leakage from a periphery of a screw.
Figure 6:
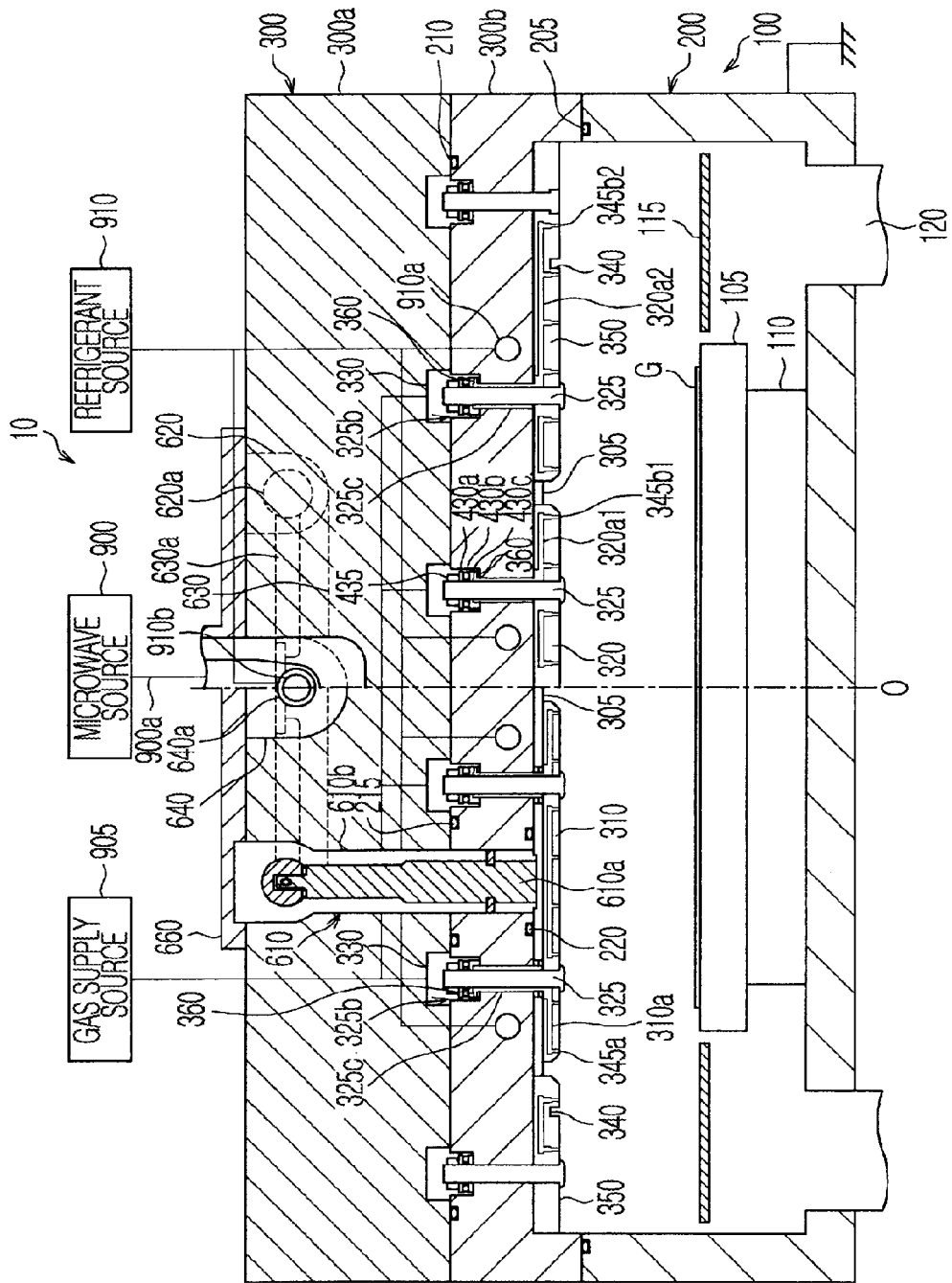
FIG. 6 is a longitudinal-sectional view of a microwave plasma processing apparatus according to a modified example of an embodiment 1 shown in FIG. 1.

FIG. 6 shows a modified example of the embodiment 1. Hereinafter, elements that are different from the embodiment 1 will be described, and descriptions about the same elements as those of the embodiment 1 will be omitted. In the present embodiment, a fifth gas passage 325c is formed between the screw 325 and the lower lid 300b. The gas passage is not formed in the screw 325. The gas introduced into the main gas passage flows in the fifth gas passage 325c through a fine hole 360 (throttle portion) formed on a washer 430c, and then, is introduced into the plurality of first gas discharging holes 345a and the plurality of second gas discharging holes 345b1 and 345b2 from the first gas passage 310a and the second gas passages 320a1 and 320a2, as shown in an expanded view of FIG. 4E.

In addition, according to the present embodiment, the front end surface of the screw 325 does not form one surface with bottom surfaces of the metal electrode 310, metal cover 320, and side cover 250, and is easy to be fabricated. The first gas passage 310a is formed in the metal electrode 310. The metal electrode 310 may be formed by bonding two aluminum plates through a welding process to form the first gas passage 310 therein. Likewise, the second gas passages 320a1 and 320a2 are respectively formed in the metal cover 320 and the side cover 350. As described above, since the gas passages are formed in the shower plate, an electric discharge does not occur in the gas passage even if the surface of the dielectric plate 305 is not covered with a metal film.

In addition, the first through third gas passages 310a, 320a, and 325a are parts of the branch gas passages.

Embodiment 2

Figure 7:
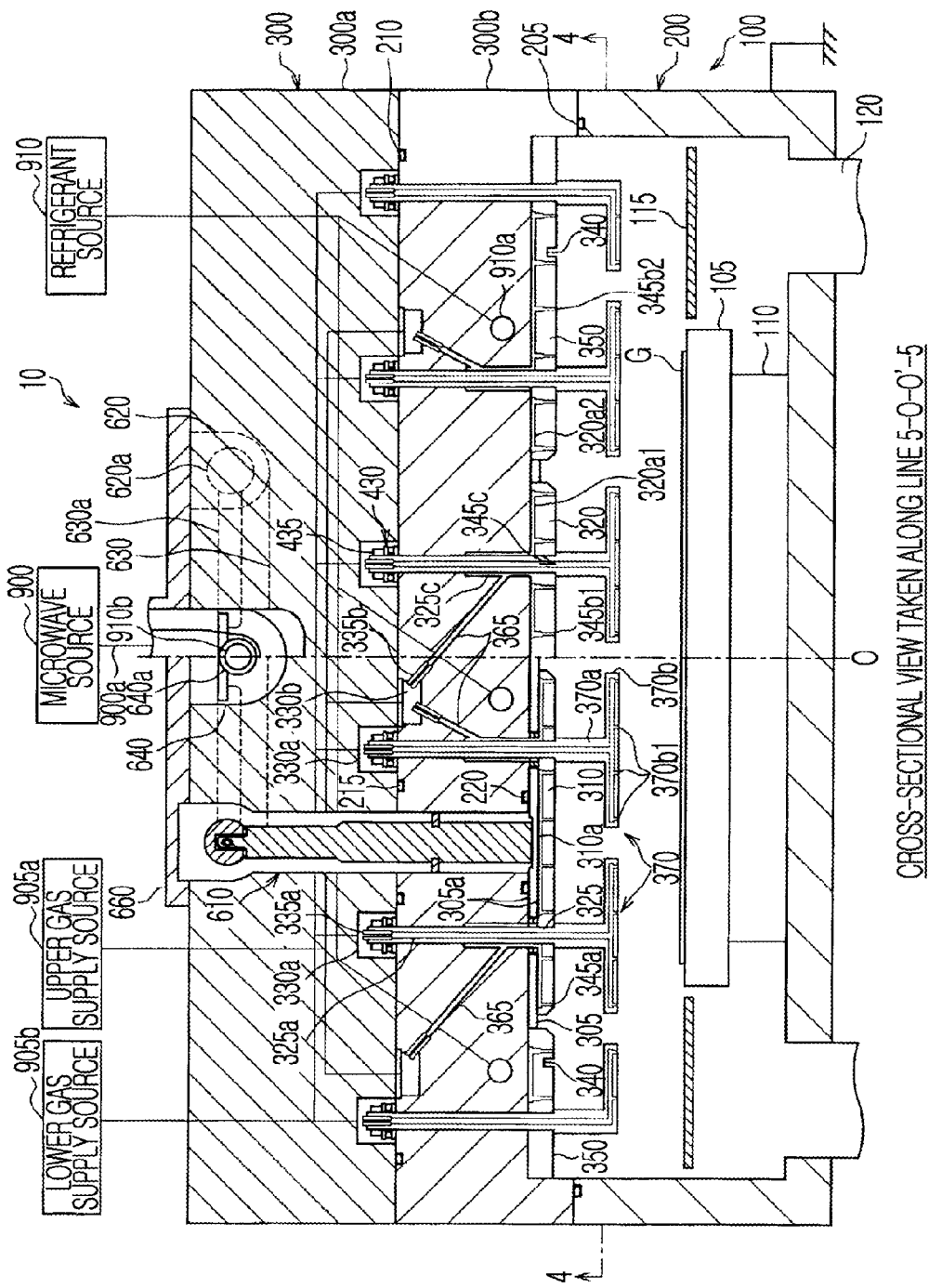
FIG. 7 is a longitudinal-sectional view of a microwave plasma processing apparatus according to an embodiment 2 of the present invention.
Figure 8:
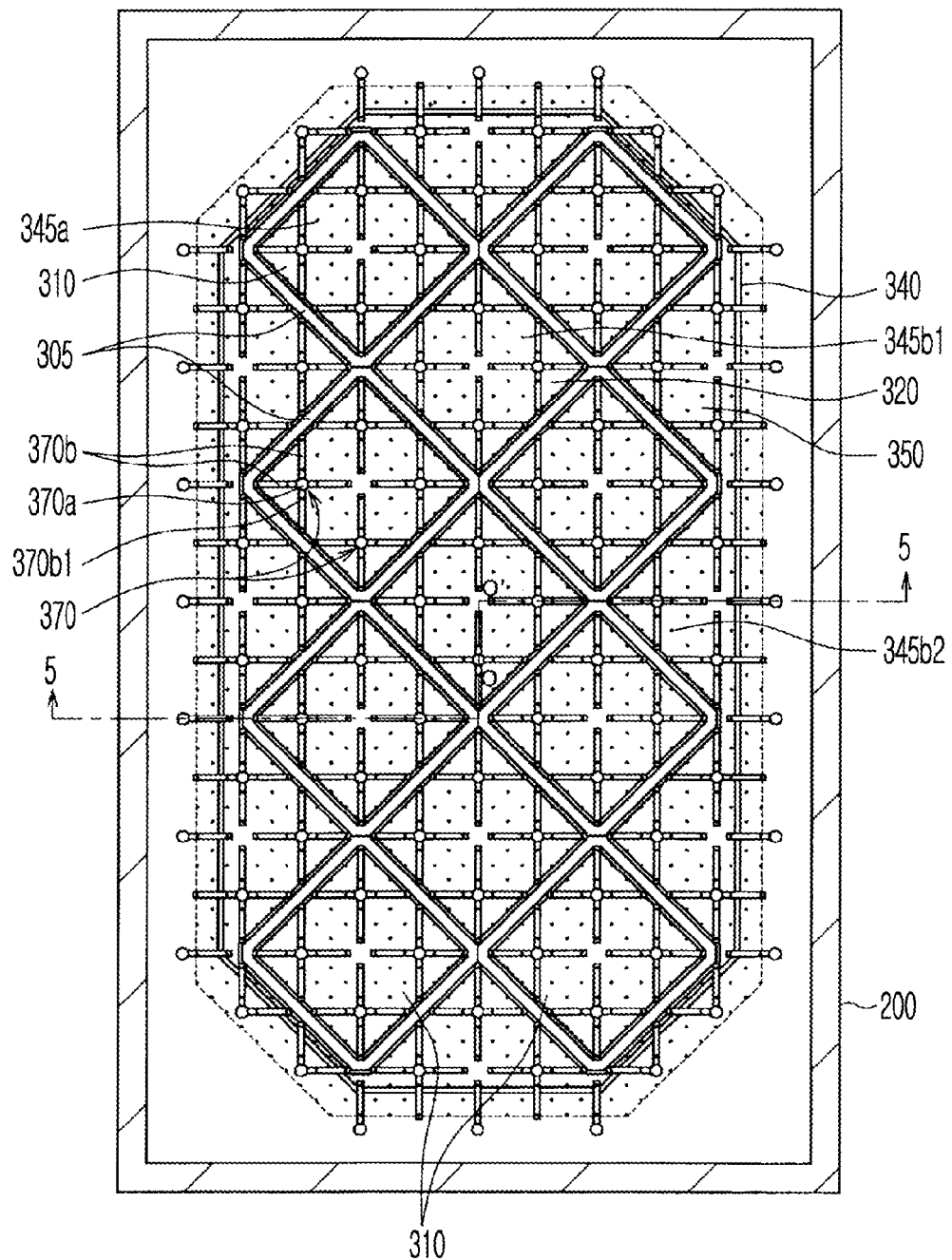
FIG. 8 is a cross-sectional view taken along a line 4-4 of FIG. 7.

Next, structures of a microwave plasma processing apparatus 10 according to the embodiment 2 of the present invention will be described with reference to FIGS. 7 and 8. FIG. 7 is a cross-sectional view taken along a line 5-O-O'-5 of FIG. 8. FIG. 8 is a cross-sectional view taken along a line 4-4 of FIG. 7. According to the embodiment 2, lower gas nozzles are provided in addition to the upper gas shower plate.

(Upper Gas Shower Plate)

In the present embodiment, two kinds of main gas passages are buried in a boundary between the upper lid 300a and the lower lid 300b. One is a first main gas passage 300a formed on a surface of the lower lid 300b, and the other is a second main gas passage 300b formed in the lower lid 300b. The second main gas passage 300b is formed by covering a groove formed in an upper surface of the lower lid 300b with a plate formed of an aluminum alloy; however, may be an elongated hole formed in the lower lid 300b.

The first main gas passage 300a is a passage for supplying gas to lower gas nozzles 370, for example, a processing gas for forming films or etching. The second main gas passage 330b is a passage for supplying gas to the upper gas shower plate, for example, a plasma excitation gas such as rare gas from an upper gas supply source 905a. The upper gas supply source 905a corresponds to a first gas supply source for supplying a first gas including the plasma excitation gas. During performing a process such as a film formation or an etching, the plasma excitation gas is supplied to the upper portion having high electron temperature and a processing gas is supplied from a lower gas supply source 905b (corresponding to a second gas supply source) to a lower portion having low electron temperature. The lower gas supply source 905b corresponds to the second gas supply source for supplying desired second gas. Accordingly, an excessive dissociation of the processing gas may be suppressed, and a plasma treatment of high quality may be performed with respect to the substrate G.

In the present embodiment, the fifth gas passage 325c is formed between the screw 325 and the lower lid 300b. A sixth gas passage 365 is formed between the second main gas passage 330b and the fifth gas passage 325c. The sixth gas passage 365 inclines toward the substrate to connect the second main gas passage 330b to the fifth gas passage 325c. Accordingly, the gas passes through the second main gas passage 330b, and then, is introduced into the fifth gas passage 325c from the sixth gas passage 365. The gas that has passed through the fifth gas passage 325c is introduced into the first gas passage 310a and the second gas passages 320a1 and 320a2, and then, is discharged toward the substrate G from the first gas discharging hole 345a and the second gas discharging holes 345b1 and 345b2 formed in the upper shower plate. The first gas discharging hole 345a and the second gas discharging holes 345b1 and 345b2 are examples of a first gas discharging unit that discharges the first gas supplied from the first gas supply source to a first space that is an inner space of the processing container adjacent to the lower surface of the lid 300.

In the present embodiment, a tubule 335a for narrowing the second main gas passage 325a and a tubule 335b for narrowing the sixth gas passage 365 are formed in order to restrict the gas conductance of the branch gas passages. Accordingly, the gas conductances of the second main gas passage 325a and the sixth gas passage 365 are much less than the gas conductance of the main gas passage 330.

(Lower Gas Nozzle)

In the present embodiment, the lower gas nozzles 370 are provided in a space between the ceiling surface of the lid 300 and the substrate G, as well as the upper gas shower plate. The screws 325 penetrate through the dielectric plate 305 and the metal electrode 310 to be connected to first gas pipes 370a.

The first gas pipes 370a are disposed on the ceiling surface at regular pitches. As shown in FIG. 8, four second gas pipes 370b are connected to a front end of the first gas pipe 370a in a cross-shape.

The second gas pipes 370b are substantially perpendicular to the first gas pipe 370a, and are arranged at regular angles around the first gas pipe 370a.

A plurality of fourth gas discharging holes 370b1 are formed on surfaces of the branch gas passages (second gas pipes 370b), which face the substrate G. The gas introduced into the first main gas passage 330a passes through the tubule 335a, the third gas discharging hole 345c, the first gas pipe 370a, and the second gas pipe 370b, and then, is discharged to the substrate G from the fourth gas discharging hole 370b1.

The lower gas nozzle 370 is formed of an aluminum alloy having an alumina protective film on a surface thereof. As shown in FIG. 8, some lower gas nozzles 370 located on a periphery portion may include one or two second gas pipes 370b. Also, in the present embodiment, the screw 325 and the first gas pipe 370a, and the first gas pipe 370a and the second gas pipe 370b are formed integrally with each other; however, may be formed separately from each other. The number of second gas pipes 370b connected to the first gas pipe 370a is not limited to 4, and may not be perpendicularly connected to the first gas pipe 370a.

According to the upper gas shower plate and the lower gas nozzles 370 of the present embodiment, the throttle portion is formed on the upper stream side of the branch gas passage so as to suppress the flow rate of gas discharged from the gas discharging holes to be low, and to introduce the gas evenly on the substrate of large area. Thus, the plasma treatment with high quality may be uniformly performed.

In addition, according to the lower gas nozzles 370 of the present embodiment, there is no possibility of bending due to the thermal expansion when compared with the conventional shower head, in which gas pipes are integrally formed as a lattice. In addition, since the lower gas nozzle 370 is formed of metal, a problem of rigidity with respect to the conventional shower head formed of the dielectric plate 305 does not occur, and the lower gas nozzle 370 may be applied to the large substrate. In addition, abnormal discharge occurring in the gas pipe may be prevented.

Figure 9:
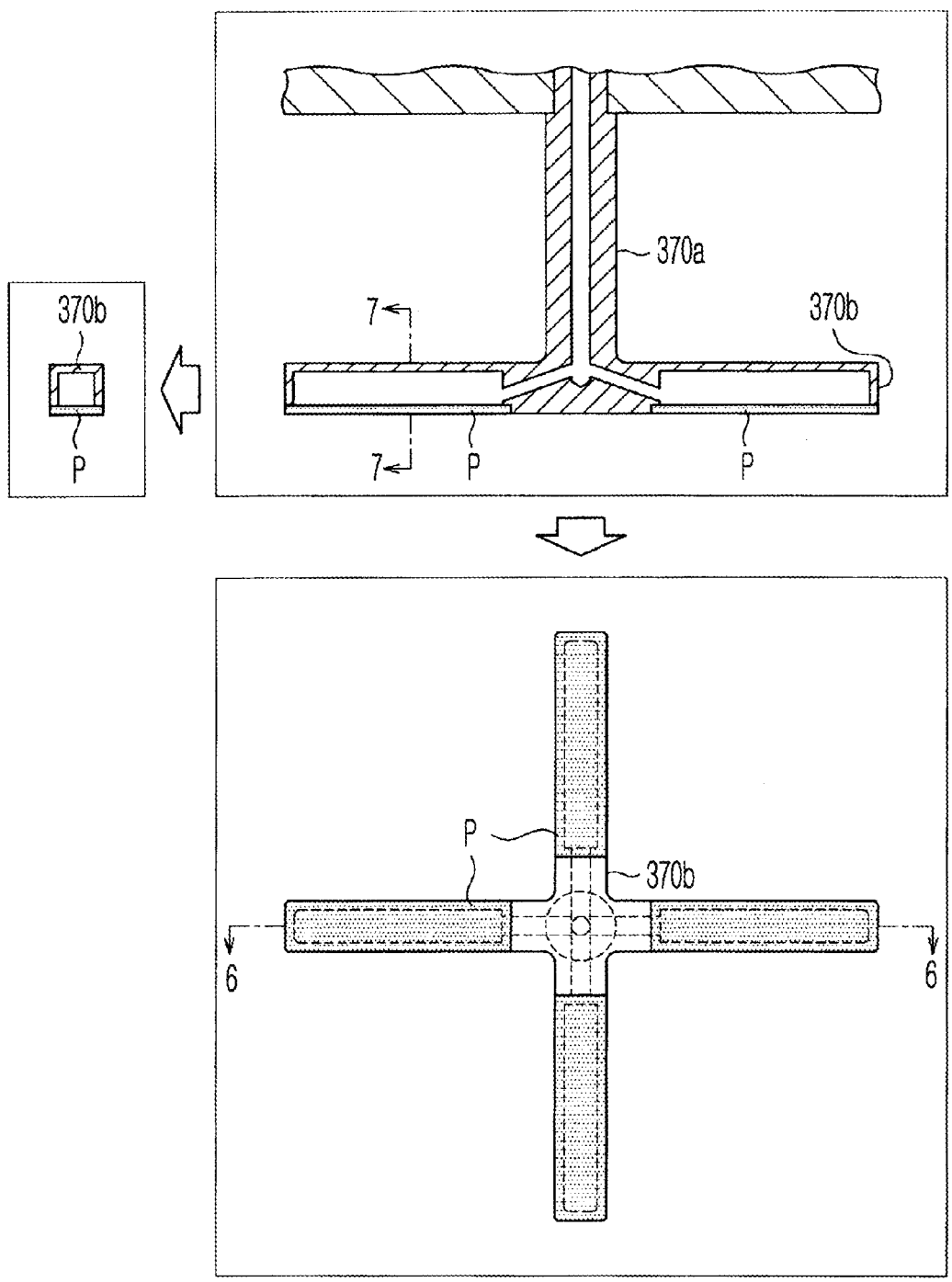
FIG. 9 is a longitudinal and transverse sectional view and a bottom surface view of a lower gas nozzle formed of a porous material according to the embodiment 2 of the present invention.

In the lower gas nozzle 370, a part of the second gas pipe 370b may be formed of, for example, a porous material P, as shown in FIG. 9. An upper diagram of FIG. 9 is a cross-sectional view of the lower gas nozzle 370 (cross-section taken along a line 6-6 of a lower diagram in FIG. 9), the lower diagram of FIG. 9 shows a bottom surface of the lower gas nozzle 370, and a left diagram of FIG. 9 shows a cross-section of the second gas pipe 370b (cross-section taken along a line 7-7 of the upper diagram in FIG. 9). The porous material P is formed of metal such as aluminum or ceramics such as alumina.

In this case, the gas is discharged into the processing chamber through the first gas pipe 370a and between pores in the porous material P of the second gas pipe 370b. Therefore, the flow rate of the gas may be sufficiently reduced by the above structure before discharging the gas into the processing chamber. In addition, although not shown in FIG. 9, a single or plurality of slits may be formed on the second gas pipe 370b so that the gas may be introduced into the processing chamber from the opening formed as slits disposed in the cross-shape.

Embodiment 3

Figure 10:
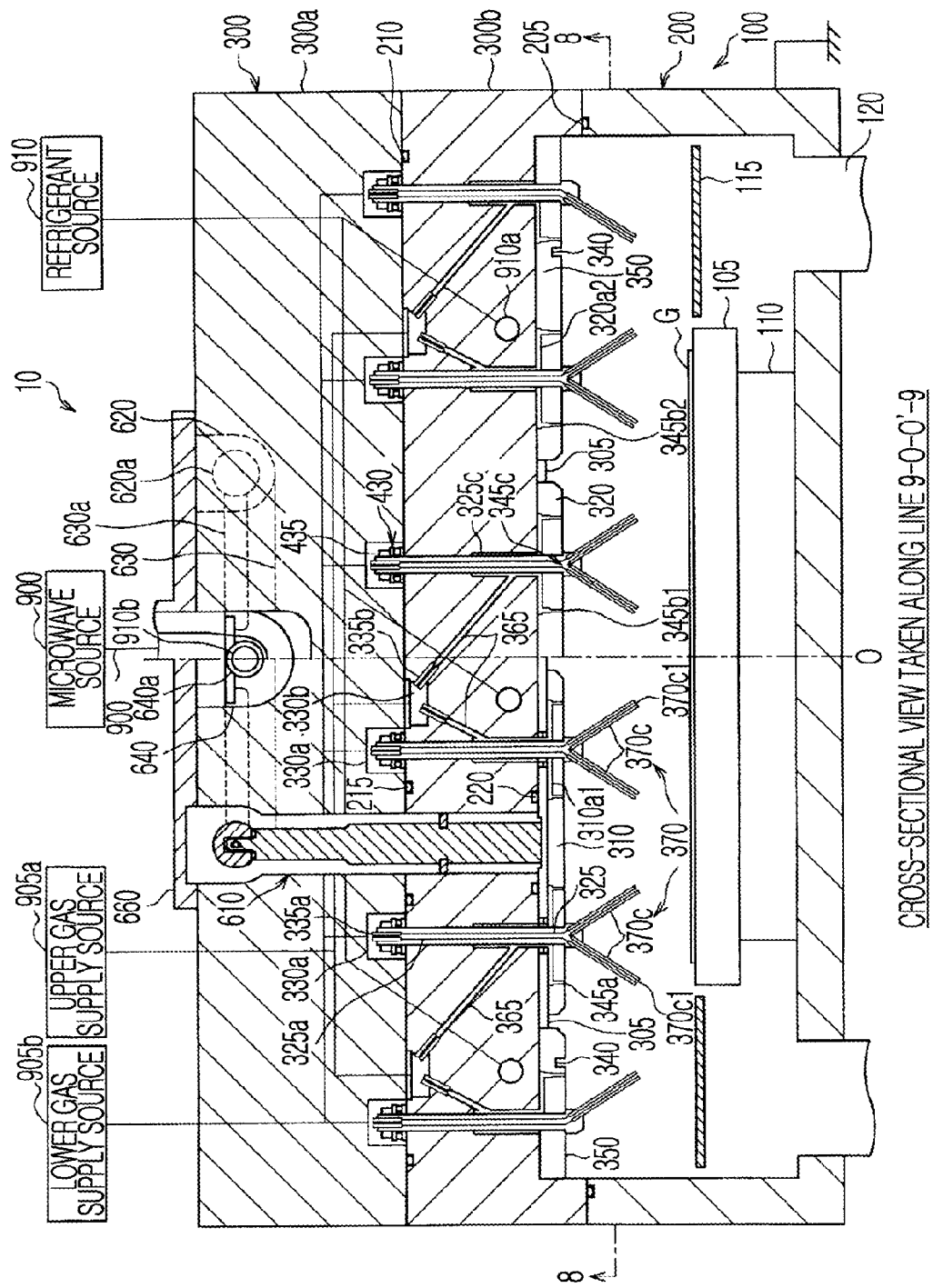
FIG. 10 is a longitudinal-sectional view of a microwave plasma processing apparatus according to an embodiment 3 of the present invention.
Figure 11:
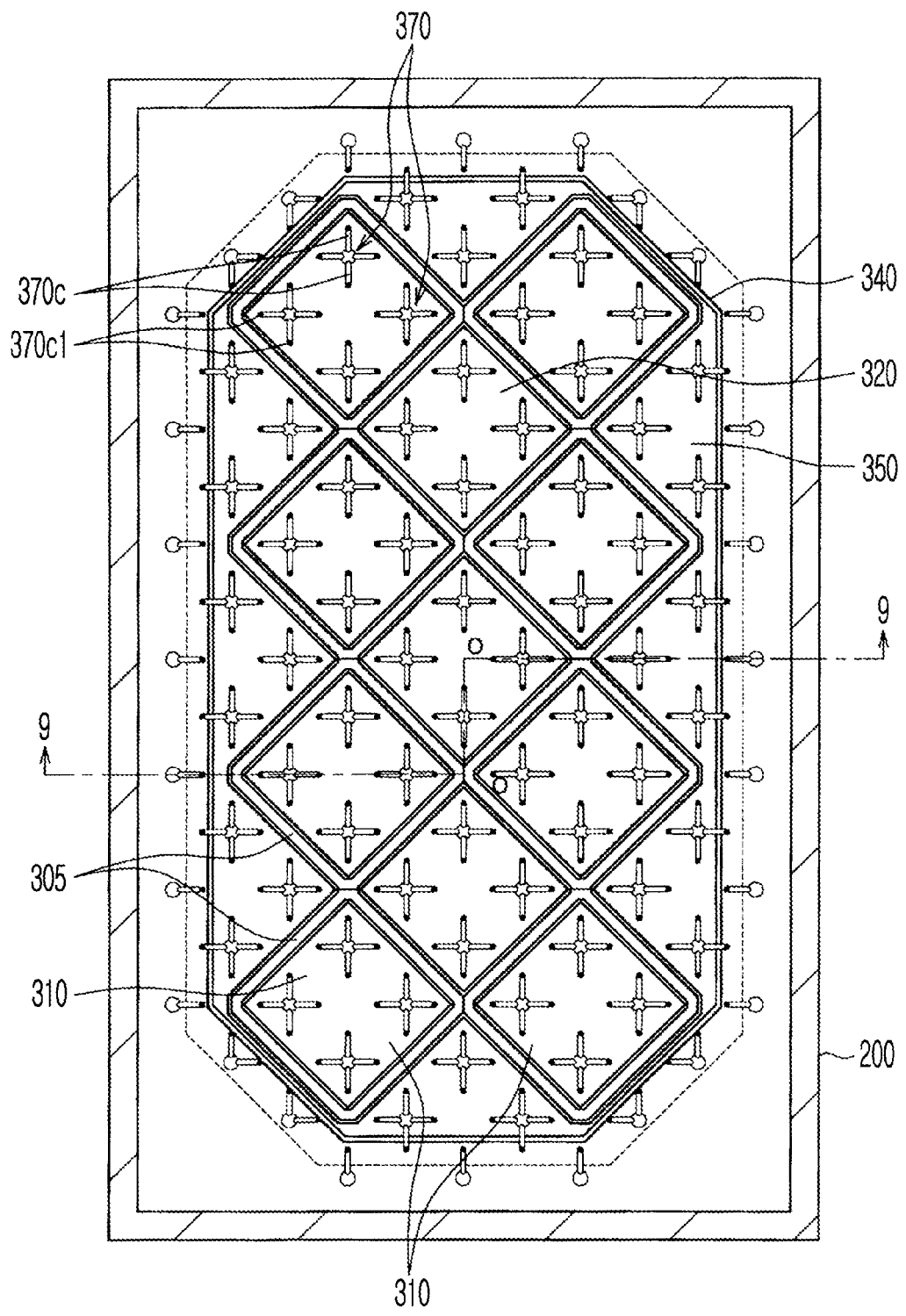
FIG. 11 is a cross-sectional view taken along a line 8-8 of FIG. 10.

Next, configuration of a microwave plasma processing apparatus 10 according to an embodiment 3 of the present invention will be described with reference to FIGS. 10 and 11. FIG. 10 is a cross-sectional view taken along a line 9-O-O'-9 of FIG. 11. FIG. 11 is a cross-sectional view taken along a line 8-8 of FIG. 10. According to the embodiment 3, lower gas nozzles are formed different from the lower gas nozzles 370 according to the embodiment 2.

That is, according to the present embodiment, each of the plurality of lower gas nozzles 370 includes four third gas pipes 370c. The third gas pipe 370c is formed of ceramics such as alumina, a glass material such as quartz, or metal such as an aluminum alloy. The four third gas pipes 370c are fixed on the screws 325 by welding, adhesion, press-fitting, set screw, and the like. The four third gas pipes 370c are arranged at substantially regular angles around the plurality of branch gas passages (screw 325). Each of the third gas pipes 370c is formed as a pipe. A fourth gas discharging hole 370c1 is formed on a front end of the third gas pipe 370c. The gas introduced into the first main gas passage 330a passes through the tubule 335a, the third gas discharging hole 345c, and the third gas pipe 370c, and then, is discharged toward the substrate G from the fourth gas discharging hole 370c1. The fourth gas discharging hole 370b1 and the fourth gas discharging hole 370c1 are examples of a second gas discharging unit that discharges a second gas supplied from the second gas supply source into a second space which is a space in the processing container located between the first space and a space for receiving the substrate G.

According to the above structure, as shown in FIGS. 10 and 11, a plurality of fourth gas discharging holes 370c1 are formed at regular pitches equal intervals in a plane that faces and parallels the substrate G, and thus, the plasma process may be uniformly performed on the substrate G. In addition, the third gas pipes 370c have thin external shapes, and do not interfere with dispersion of the plasma. Therefore, the plasma process may be performed at high rate. In addition, since the lower gas nozzles 370 are formed of the third gas pipes 370c of pipe shapes, fabrication costs of the lower gas nozzle 370 are reduced and the lower gas nozzle has a simple structure, and thus, it is easy to maintain the lower gas nozzles 370.

As shown in FIG. 11, some of the lower gas nozzles 370 located on a periphery portion may include only one or two third gas pipes 370c. The screw 325 and the third gas pipes 370c are directly connected to each other in the present embodiment; however, a connecting portion of the third gas pipe 370c may be separated from the screw 325. The number of third gas pipes 370c connected to the screw 325 is not limited to 4, and the third gas pipes 370c may be perpendicularly connected to the screw 325 perpendicularly to the screw 325.

Embodiment 4

Figure 12:
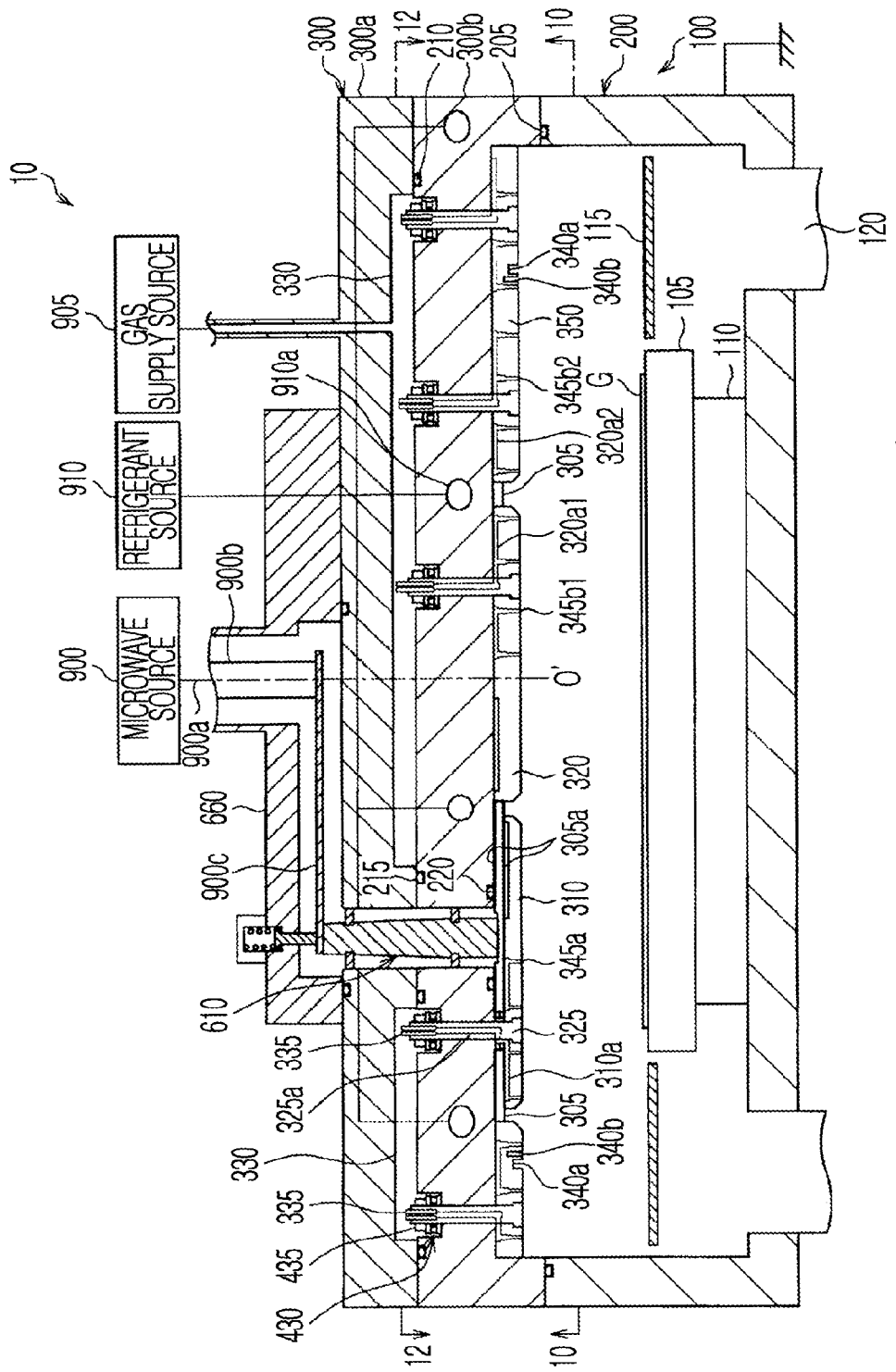
FIG. 12 is a longitudinal-sectional view of a microwave plasma processing apparatus for semiconductor according to a fourth embodiment of the present invention.
Figure 13:
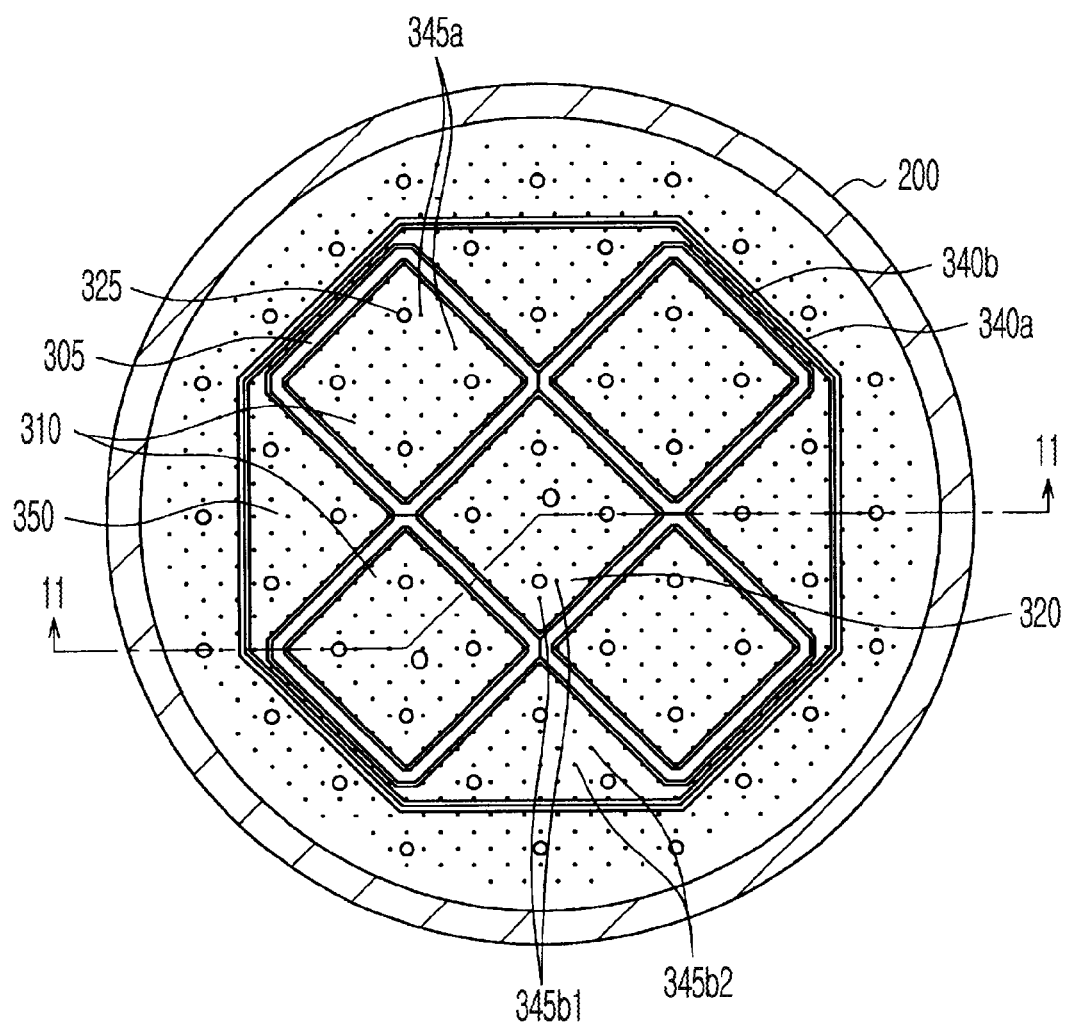
FIG. 13 is a cross-sectional view taken along a line 10-10 of FIG. 12.
Figure 14:
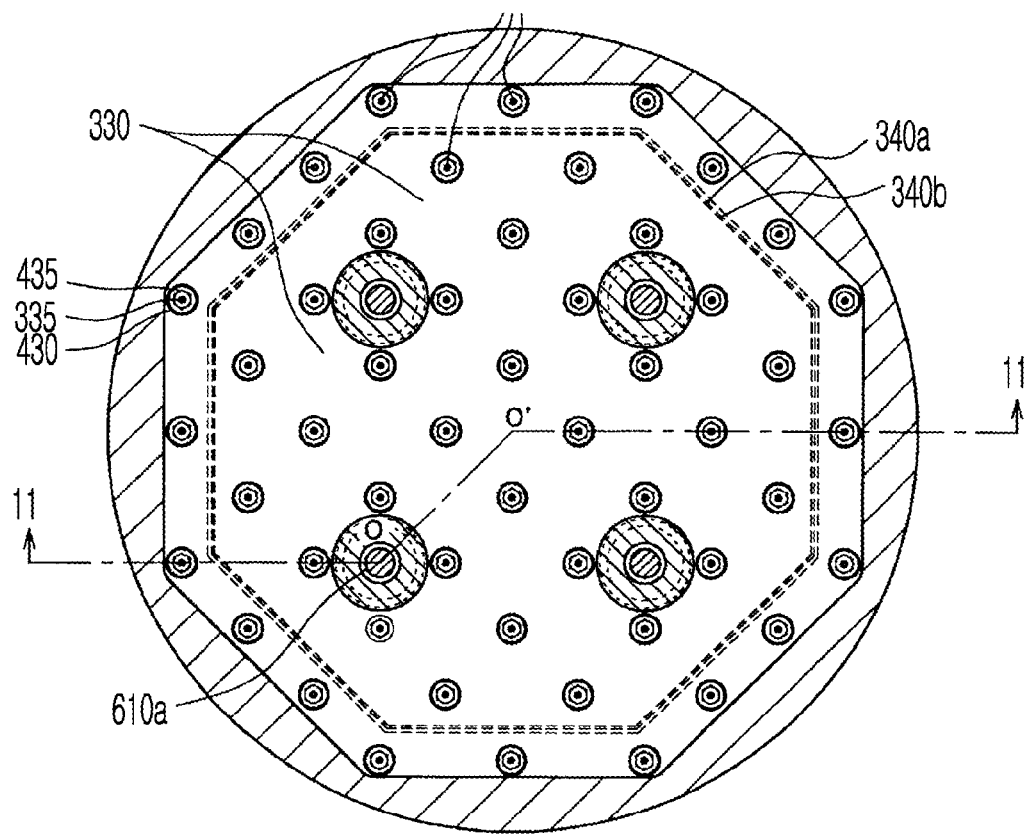
FIG. 14 is a cross-sectional view taken along a line 12-12 of FIG. 12.

Next, configurations of a microwave plasma processing apparatus 10 according to an embodiment 4 of the present invention will be described with reference to FIGS. 12 through 14. FIG. 12 is a cross-sectional view taken along a line 11-O-O'-11 of FIG. 13. FIG. 13 is a cross-sectional view taken along a line 10-10 of FIG. 12. FIG. 14 is a cross-sectional view taken along a line 12-12 of FIG. 12.

The microwave plasma processing apparatus 10 according to the embodiment 4 is for a circular substrate (for example, semiconductor substrate), and includes the upper gas shower plate only. Gas passages in the metal electrode 310, the metal cover 320, and the side cover 350 are formed by grooves respectively formed in the surfaces of the members. The third gas passage 325a is formed in the screw 325.

Referring to FIG. 13, four cells are disposed, and the first gas discharging holes 345a and the second gas discharging holes 345b1 and 345b2 are arranged at regular pitches. The microwave is supplied from a microwave source 900 and transferred to a coaxial waveguide 900b through a transmission line 900a, and then, is transmitted to the first coaxial waveguide 610 from a branching plate 900c. Each of the coaxial waveguides is disposed in the lid cover 660.

The gas supplied from the gas supply source 905 flows to the main gas passage 330 as shown in FIG. 14. The main gas passage 330 is an octagonal space formed between the upper lid 300a and the lower lid 300b. Accordingly, a boundary between the upper lid 300a and the lower lid 300b has a surface that becomes the gas passage.

Also in the present embodiment, the main gas passage 330 distributes the gas to the third gas passages 325a that are formed in the plurality of screws 325. The tubule 335 for narrowing a passage is inserted to an inlet of the third gas passage 325a.

In the present embodiment, in order to make the flow rate of the gas around the substrate G uniform, it is designed so that the flow amount of the gas discharged from the gas discharging holes formed on a peripheral portion of the processing container 100 is greater than the flow amount of the gas discharged from the gas discharging holes formed on a center portion of the processing container 100. That is, when it is assumed that the gas conductance of the tubule 335 is Cr and the number of gas discharging holes, to which the gas is supplied from each of the tubules 335, is N, a value of Cr/N increases as the tubule 335 becomes closer to the periphery portion. Accordingly, the uniform plasma process may be performed on the substrate G in the processing container 100 having a small size. In the present embodiment, inner diameters of the tubules 335 are fixed as 0.4 mm, and then, lengths of the tubules 335 are changed to adjust the gas conductance. Otherwise, the gas conductance may be adjusted by changing the inner diameters of the tubules 335.

In the present embodiment, two grooves 340a and 340b for suppressing propagation of a conductor surface wave (a metal surface wave) are formed. When a plurality of grooves having different sizes or different aspect ratios from each other are formed, wider range of electron density may be dealt with.

Embodiment 5

Figure 15:
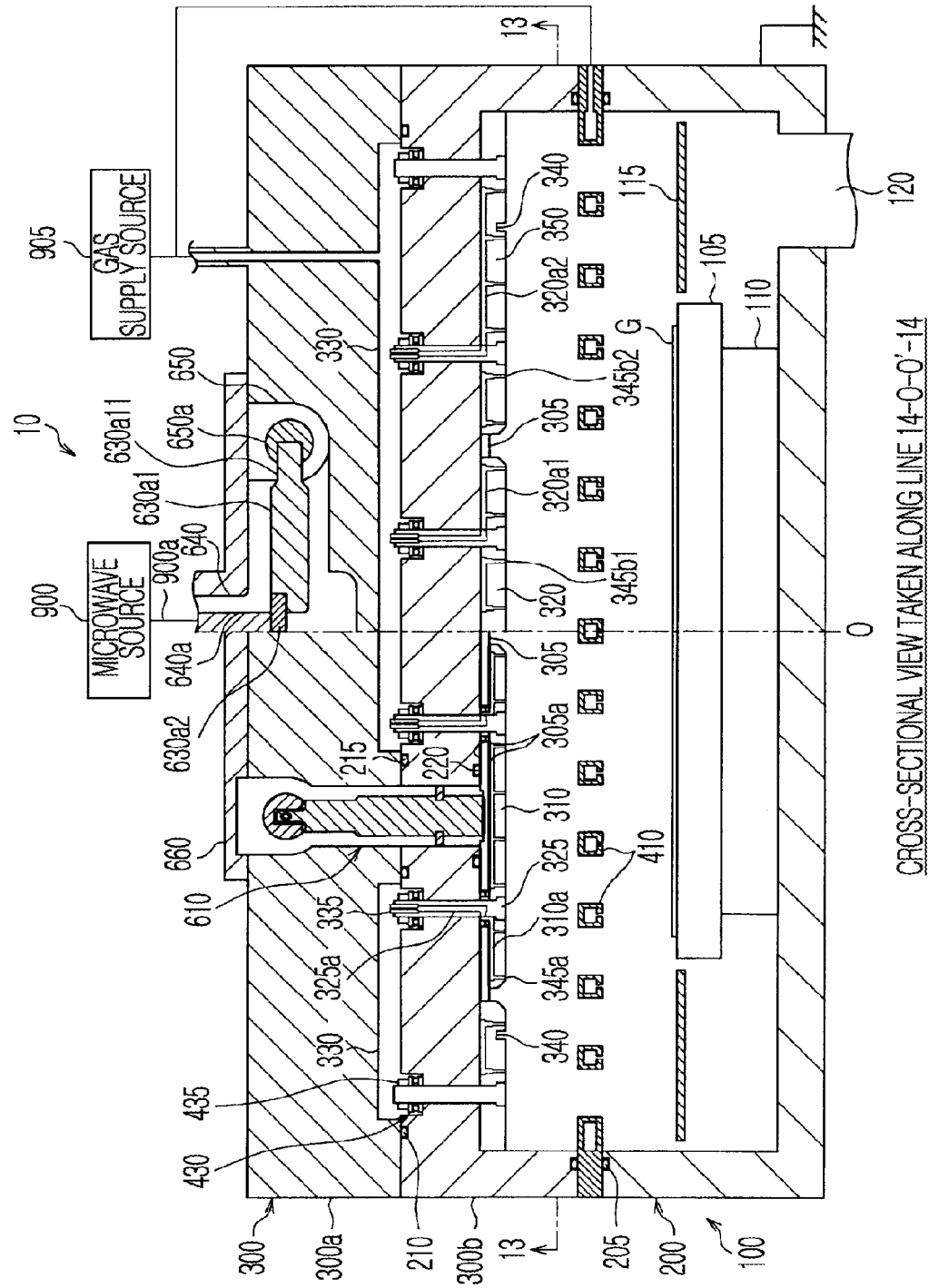
FIG. 15 is a longitudinal-sectional view of a microwave plasma processing apparatus for semiconductor according to a fifth embodiment of the present invention.
Figure 16:
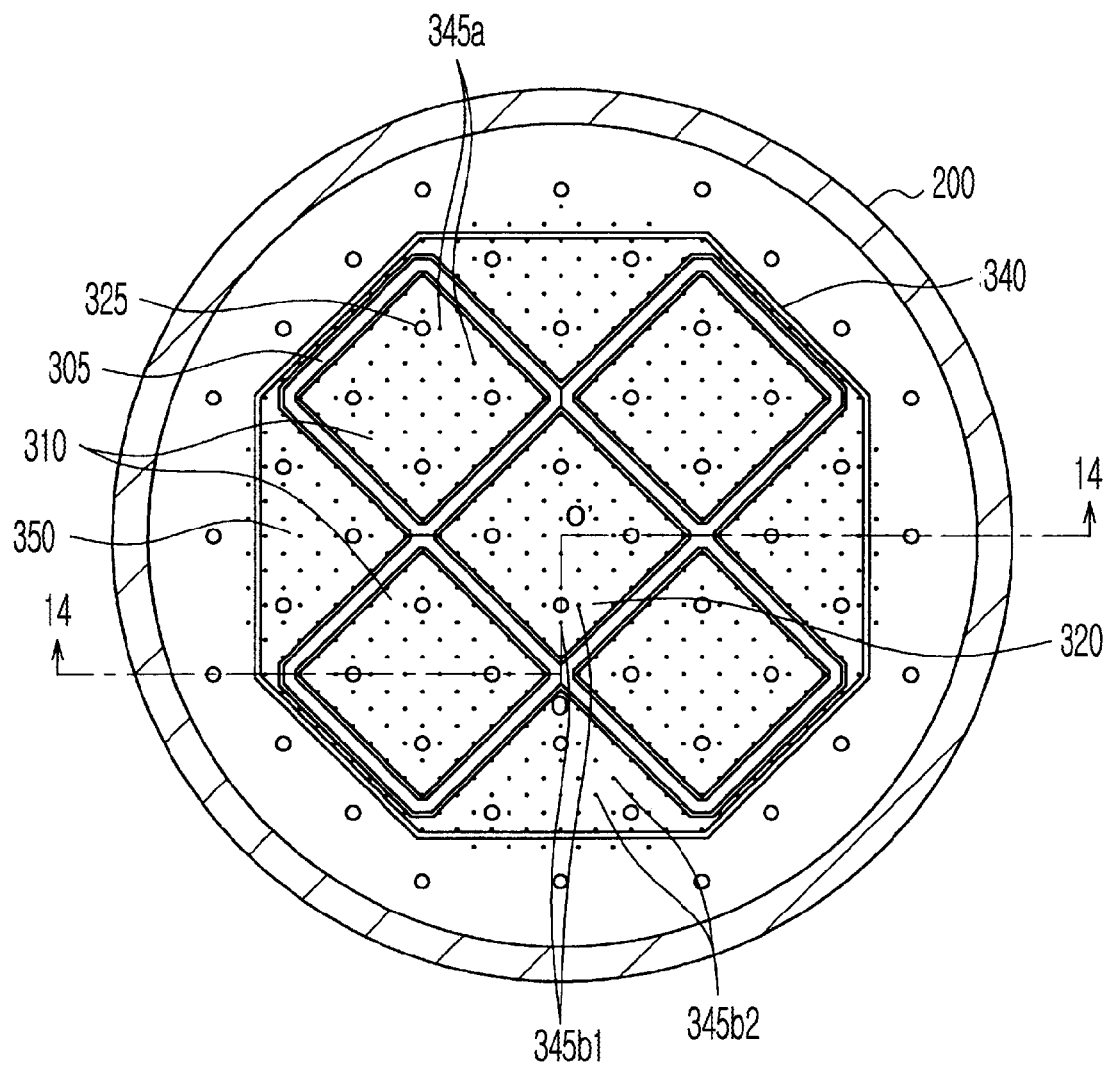
FIG. 16 is a cross-sectional view taken along a line 13-13 of FIG. 15.

Next, structures of a microwave plasma processing apparatus 10 according to an embodiment 5 of the present invention will be described with reference to FIGS. 15 and 16. FIG. 15 is a cross-sectional view taken along a line 14-O-O'-14 of FIG. 16. FIG. 16 is a cross-sectional view taken along a line 13-13 of FIG. 15. The microwave plasma processing apparatus 10 according to the embodiment 5 is for the circular substrate (for example, semiconductor substrate) like the plasma processing apparatus 10 according to the above embodiment 4; however, the present embodiment is different from the embodiment 4 in view that a lower gas shower plate 410 is formed in addition to the upper gas shower plate.

Referring to FIG. 16, four cells are disposed, and the first gas discharging holes 345a and the second gas discharging holes 345b1 and 345b2 are arranged at regular pitches. The microwave is supplied from the microwave source 900 to be transmitted to a fourth coaxial waveguide 640 through the transmission line 900a. In the present embodiment, the fourth coaxial waveguide 640 is T-branched to a third coaxial waveguide 630 (a rod 630a1 and an inner conductor connecting plate 630a2), and the third coaxial waveguide 630 is T-branched to a fifth coaxial waveguide 650.

The first gas passage 310a and the second gas passages 320a1 and 320a2 in the metal electrode 310, the metal cover 320, and the side cover 530 are formed of grooves respectively formed in upper surfaces of the elements. In the present embodiment, the third gas passages 325a are formed in the screws 325. The lower gas shower plate 410 is integrally formed with the processing container 100 as a mesh. According to the present embodiment, the plasma excitation gas, for example, is supplied to inside of the processing container from the upper gas shower plate. The processing gas is supplied from the lower gas shower plate 410 to a space located lower than the space to which the plasma excitation gas is supplied. Accordingly, desired plasma may be generated and the plasma process of excellent quality may be performed on the substrate.

The lower gas nozzles 370 and the lower gas shower plate 410 are examples of a lower gas discharging member that discharges the gas that has passed through a plurality of branch gas passages to a space between the lid 300 and the substrate G.

Embodiment 6

Figure 17:
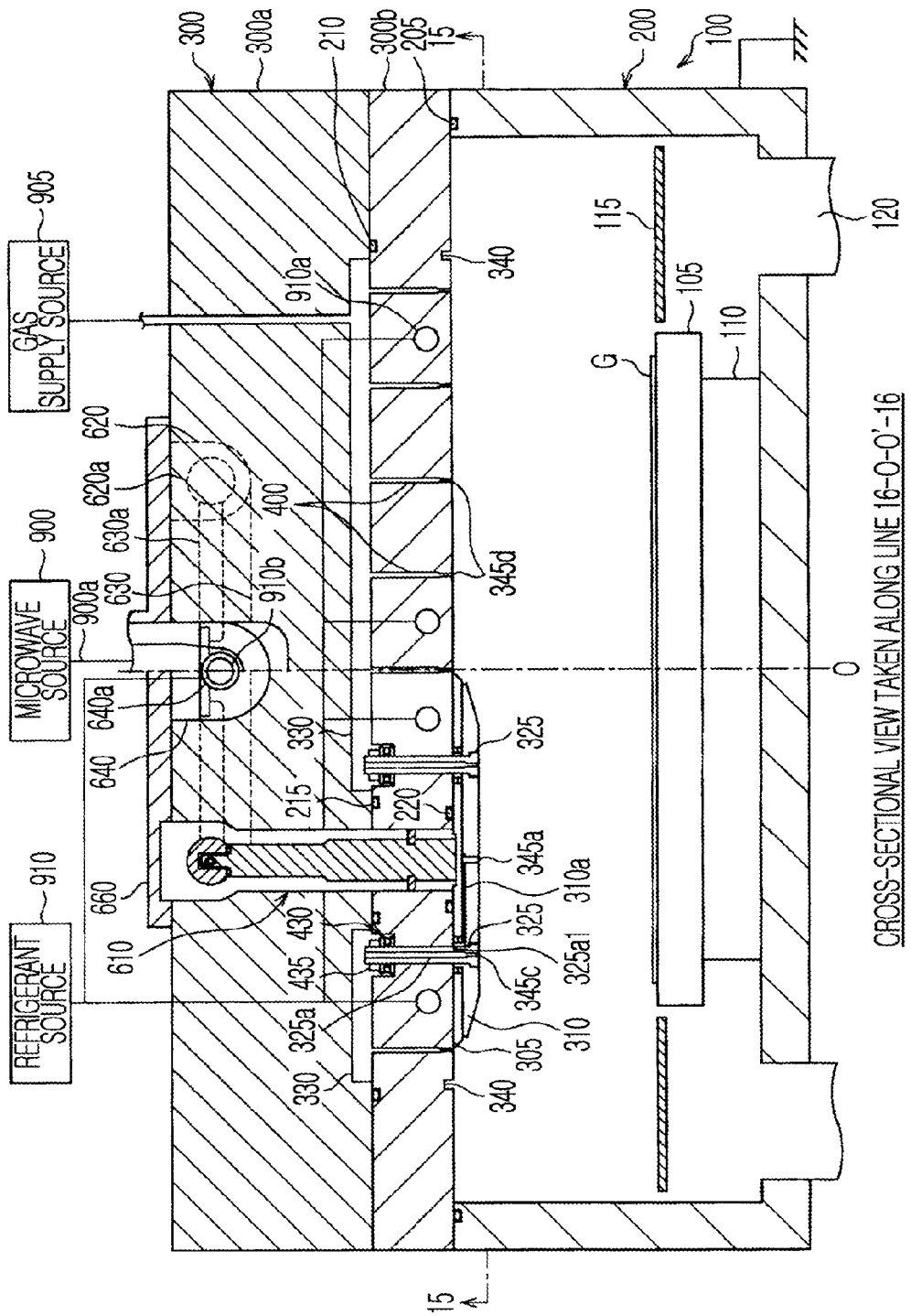
FIG. 17 is a longitudinal-sectional view of a microwave plasma processing apparatus for semiconductor according to a sixth embodiment of the present invention.
Figure 18:
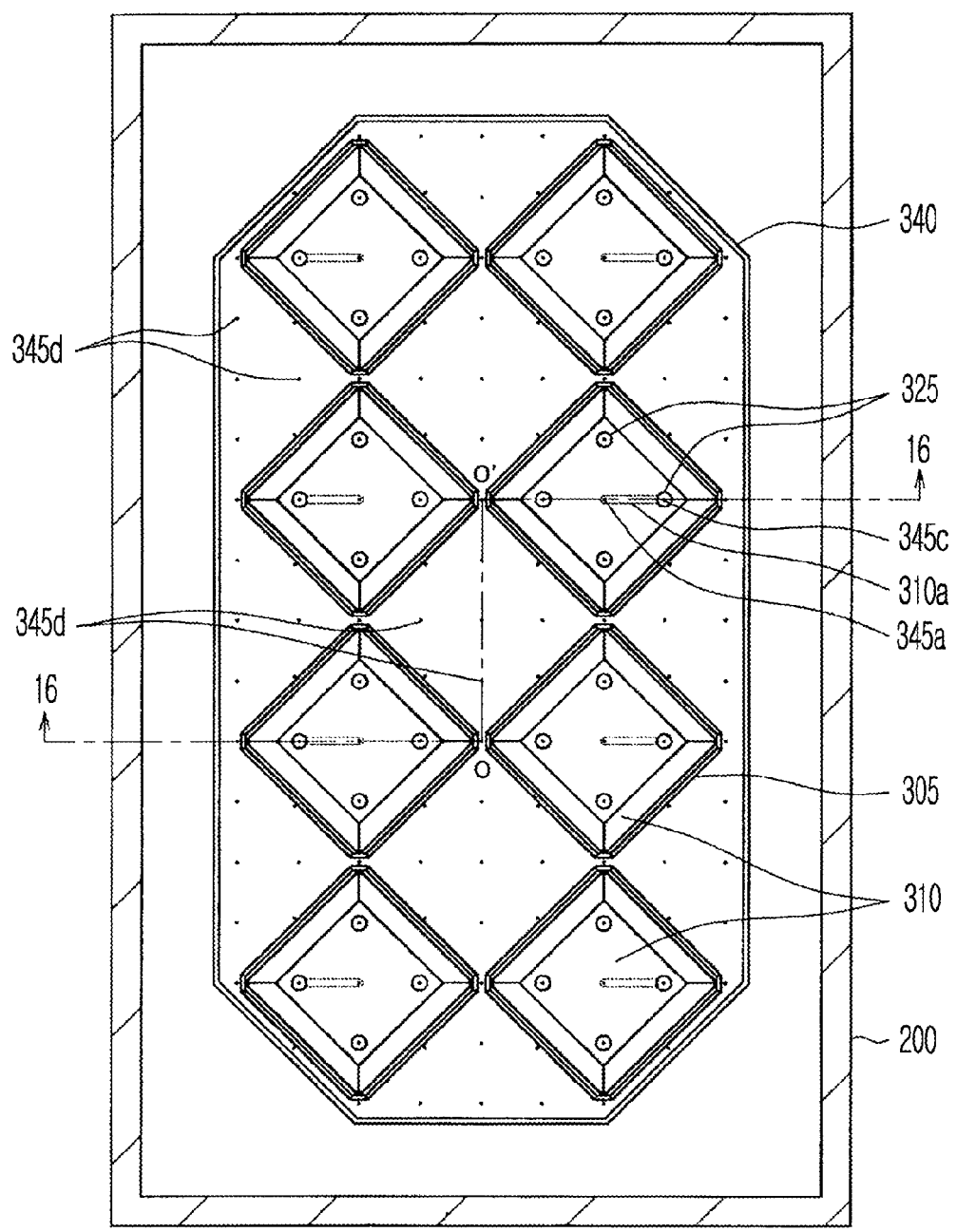
FIG. 18 is a cross-sectional view taken along a line 15-15 of FIG. 17.

Next, configurations of a microwave plasma processing apparatus 10 according to an embodiment 6 of the present invention will be described with reference to FIGS. 17 and 18. FIG. 17 is a cross-sectional view taken along a line 16-O-O'-16 of FIG. 18. FIG. 18 is a cross-sectional view taken along a line 15-15 of FIG. 17. The microwave plasma processing apparatus 10 of the present embodiment is different from the previous embodiments in that the metal cover 320 and the side cover 350 are not disposed. In addition, the microwave plasma processing apparatus 10 of the present embodiment does not include the throttle portion.

In more detail, the metal cover 320 and the side cover 350 are not disposed on a right side of a center line O shown in FIG. 17, and instead, the lower lid 300b is exposed as the ceiling surface. A plurality of gas discharging holes (referred to as fifth gas discharging holes 345d) are formed in a lower surface of the lower lid 300b. Each of the fifth gas discharging holes 345d has a lower portion that is narrower than other portions thereof.

The main gas passage 330 that is connected to the plurality of second gas discharging holes 345b is formed on a boundary between the upper lid 300a and the lower lid 300b. The gas is output from the main gas passage 330 passes through a seventh gas passage 400, and then, is discharged to inside the processing container 100 from the plurality of fifth gas discharging holes 345d.

On the other hand, on a left side of the center line O in FIG. 17, the third gas passages 325a are formed in the plurality of screws 325. A third gas discharging hole 345c that is thinner than the third gas passage 325a is formed on an end of each of the third gas passages 325a. The gas passes through the gas passage of the main gas passage 330, and then, is introduced into the processing container 100 from the plurality of third gas discharging holes 345c of the third gas passages 325a. In addition, the gas passes through the fourth gas passage 325a1 formed on the side surface of the screw 325 formed on an upper side of the third gas discharging hole 345c and the first gas passage 310a formed in the upper surface of the metal electrode 310, and then, is introduced into the plurality of first gas discharging holes 345a. Among the four screws 325 for fixing the metal electrode 310, the fourth gas passage 325a1 is formed in only one screw 325, and the other screws 325 do not include the fourth gas passage 325a1.

As shown in FIG. 18, the first gas discharging holes 345a, the fifth gas discharging holes 345d, and the third gas discharging holes 345c are arranged at regular pitches. The gas conductances of the first gas passage 310a and the first gas discharging holes 345a are set to be sufficiently greater than the gas conductance of the fourth gas passage 325a1. In addition, a fine hole located under the fifth gas discharging hole 345d, the third gas discharging holes 345c, and the fourth gas passage 325a1 have substantially same diameters and lengths as each other, and thus, the gas conductances of the above members are the same as each other. Accordingly, the gas may be evenly discharged from the entire ceiling surface.

(Depth of the Gas Passage)

In the present embodiment, the dielectric plate 305 is not covered by a metal film. As described above, when the dielectric plate 305 is not covered by the metal film, a depth of the groove (first gas passage 310a) formed in the metal electrode 310 may be equal to or less than 0.2 mm in order not to generate electric discharge in the groove formed in the metal electrode 310, for which reasons are described as follows.

When the depth of the gas passage is less than a mean free path of electrons, electrons lose the energy by colliding against the wall before obtaining an energy required for ionization from the microwave electric field due to narrow interval, and thus, it is difficult to generate the electric discharge in the gas passage. The depth of the gas passage is set to a size that does not generate discharge even under a situation that is most easy to discharge in the actual working conditions.

The mean free path is defined as ua/vc. Here, "ua" denotes an average speed of the electrons and "vc" denotes a collision frequency of the electrons. The average speed ua of the electrons is defined as ua=$(8 kT/\pi m)^{1/2}$. Here, "k" denotes Boltzmann integer, "T" denotes an electron temperature, and "m" denotes mass of the electron. If it is assumed that the electron temperature for maintaining the discharge in a gap is 3 eV, ua=$1.14 \times 10^6$ m/s from the above equation.

When the collision frequency of the electron and an angular frequency of the microwave are equal to each other, the maximum energy may be given to the electron from the microwave, and thus, the discharge is most easily generated. When the frequency of the microwave is 915 MHz and a value of pressure satisfies vc=$5.75 \times 10^9$ Hz (about 200 Pa in case of Ar gas), the discharge is most easily generated. Here, the mean free path is 0.20 mm according to the above equation. That is, when the depth of the gas passage is 0.2 mm or less, the plasma may be always stably excited without generating the discharge in the gas passage.

In the upper shower head of the present embodiment, the gas discharging holes 345a and 345c are formed in the metal electrode 310, and at the same time, a plurality of gas discharging holes 345d are directly formed in the metal lid 300. Accordingly, etching of the surface of the dielectric plate 305 and the deposition of reaction products on the inner surface of the processing container may be suppressed, and thereby promoting reduction of contamination or particles. In addition, since the upper gas shower head is formed of metal, it is easy to process the upper gas shower head and expenses may be reduced greatly. However, according to the present embodiment, the gas conductance is adjusted at an end portion of the branch gas passage, and thus, it is difficult to reduce the flow rate of gas.

Embodiment 7

Next, configurations of a microwave plasma processing apparatus 10 according to an embodiment 7 of the present invention will be described with reference to FIGS. 19 and 20.

Figure 19:
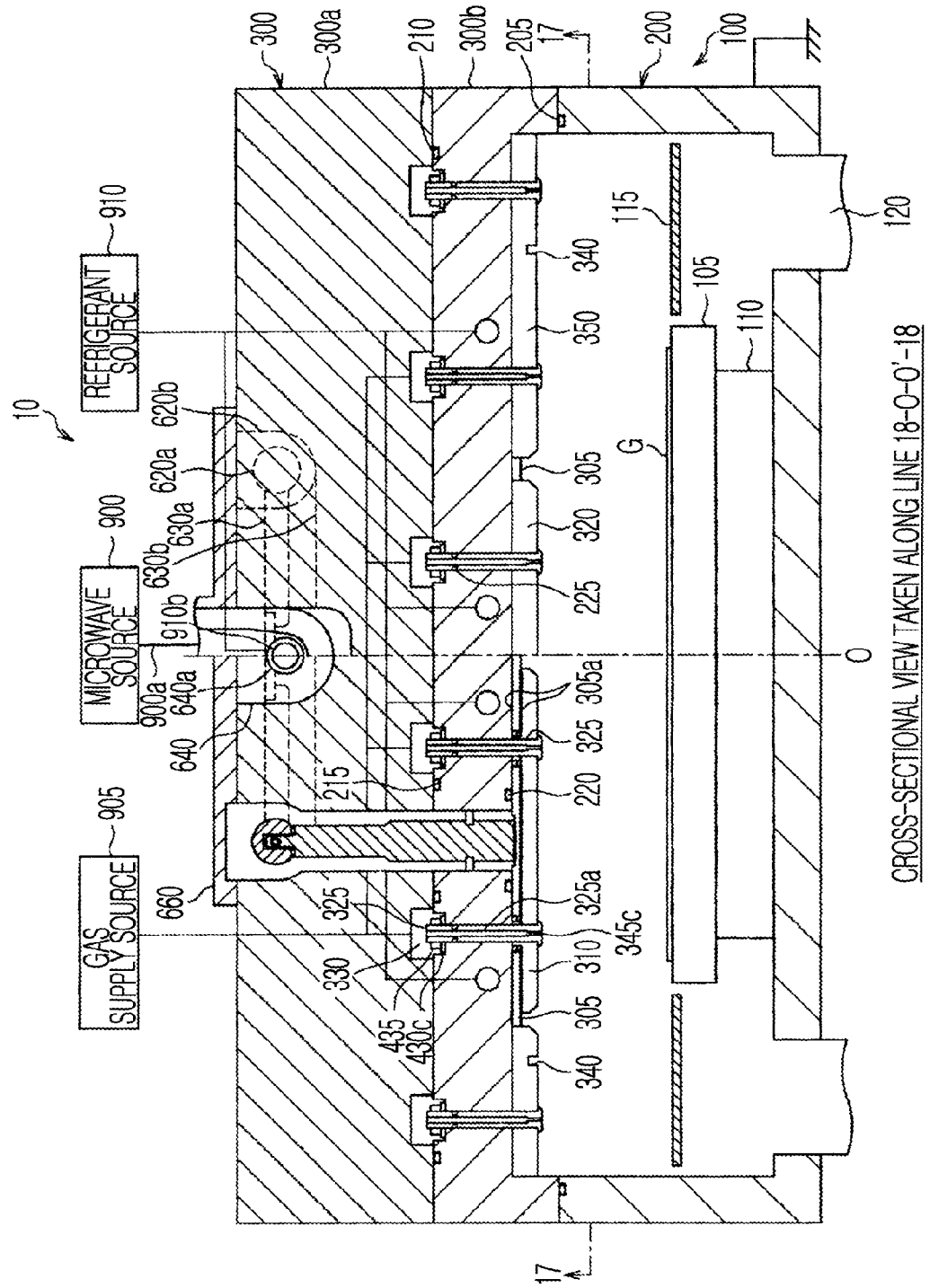
FIG. 19 is a longitudinal-sectional view of a microwave plasma processing apparatus for semiconductor according to a seventh embodiment of the present invention.
Figure 20:
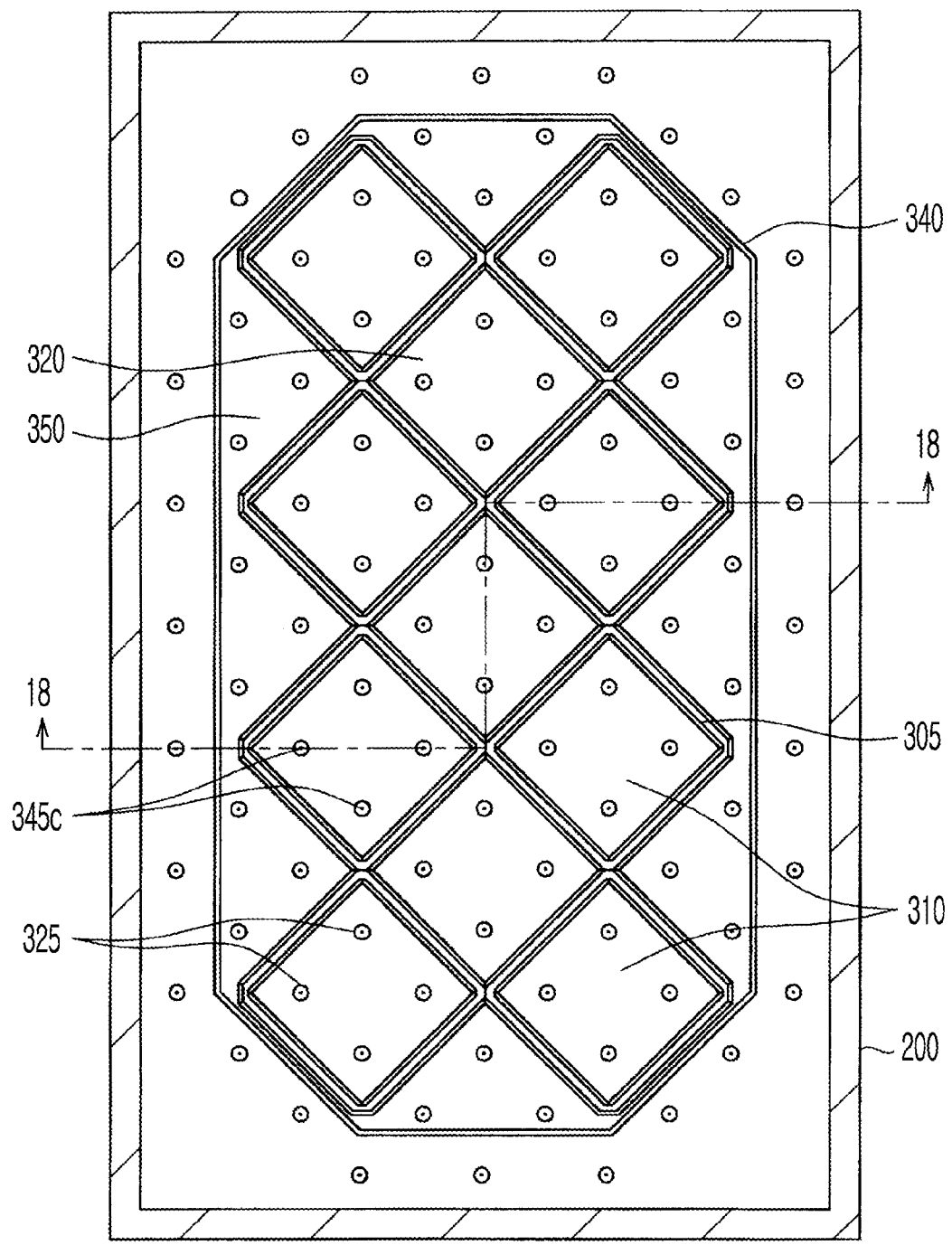
FIG. 20 is a cross-sectional view taken along a line 17-17 of FIG. 19.

FIG. 19 is a cross-sectional view taken along a line 18-O-O'-18 of FIG. 20. FIG. 20 is a cross-sectional view taken along a line 17-17 of FIG. 19.

In the present embodiment, the throttle portion (tubule 335) is not formed. The gas passes through the main gas passage 330, and then, is introduced into the processing container from the third gas discharging holes 345c through the third gas passages 325a. As shown in FIG. 20, the plurality of third gas discharging holes 345c are arranged in the ceiling surface at regular pitches. Each of the third gas discharging holes 345c has a lower portion that is narrower than any other portions thereof or the third gas passage 325a. Accordingly, the gas may be evenly discharged from the entire ceiling surface. The metal electrode 310, the metal cover 320, and the side cover 350 do not include the gas discharging hole.

Figure 4C:
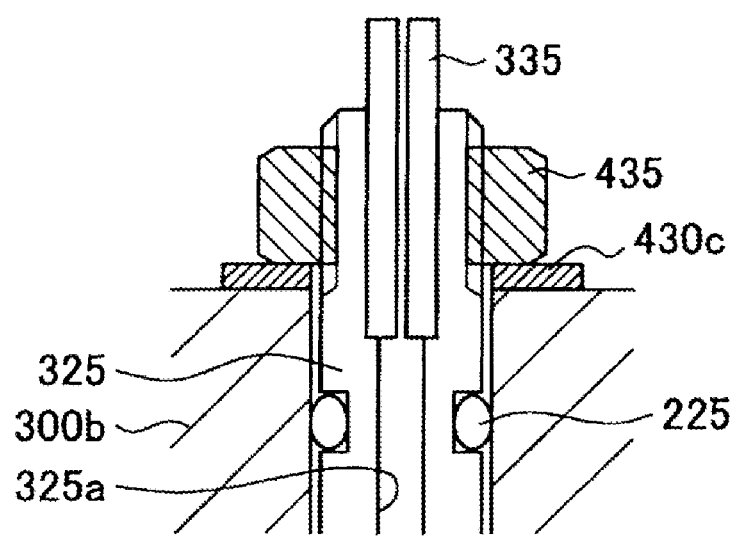
FIG. 4C is a diagram of an apparatus for preventing gas leakage from a periphery of a screw.

In the present embodiment, as shown in FIG. 19 and the expanded view of FIG. 4C, the nut 435 is attached onto the periphery of the screw 325 that protrudes in the main gas passage 330. An O-ring 225 is disposed on a contacting surface between the lower lid 300b and the screw 325 in order to seal a gap between the lower lid 300b and the screw 325. Accordingly, the gas leakage from around the screw 325 may be prevented. The O-ring 225 may be located on a location contacting the washer 430c. An elastic member such as a wave washer, a disk spring, and the like may be used with the O-ring 225. For sealing the gap, a seal washer may be used instead of using the O-ring 225.

In addition, in order to prevent the gas from leaking from the periphery of the screw 325, for example, as shown in FIG. 4B, a disk spring 430d may be used. The disk spring 430d has a spring force that is strong enough to push the O-ring 220. Since upper and lower angles of the disc spring 430d are pushed and adhered to the nut 435 and the lower lid 300b, the gas leakage may be suppressed. The disc spring 430d may be formed of SUS plated with Ni.

Figure 4D:
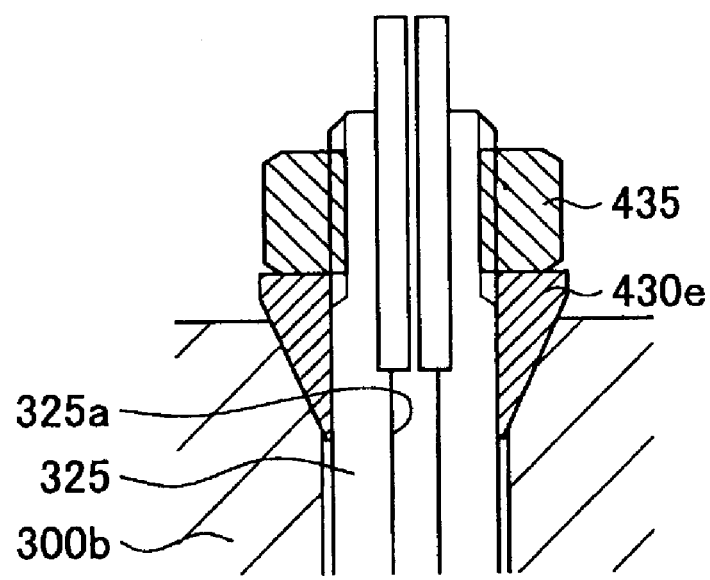
FIG. 4D is a diagram of an apparatus for preventing gas leakage from a periphery of a screw.
Figure 4E:
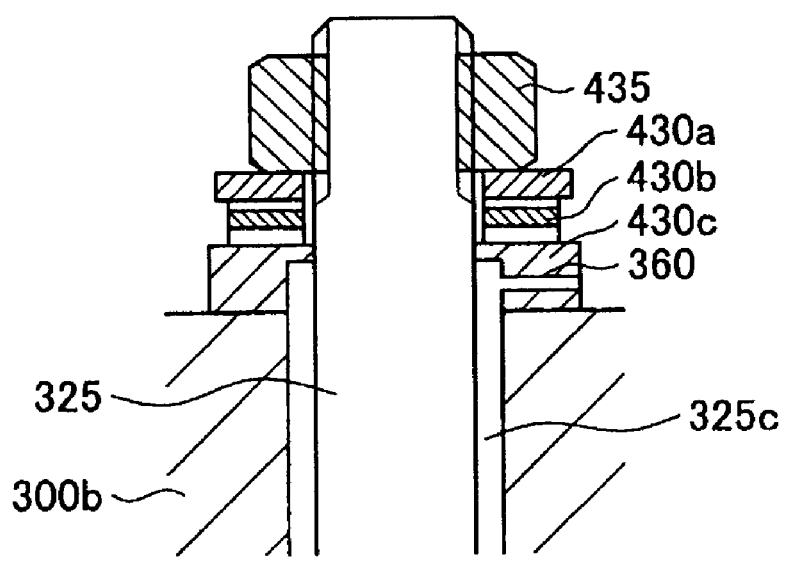
FIG. 4E is a diagram of an apparatus for preventing gas leakage from a periphery of a screw.

As shown in FIG. 4D, the gas leakage may be prevented by using a taper washer 430e. When the nut 435 is fastened firmly, the taper washer 430e and the lower lid 300b contact each other in an inclined direction, and thus, the taper washer 430e, the lower lid 300b, and the screw 325 are strongly pushed and adhered so as to remove a gap. Thus, a gap between the screw 325 and the lower lid 300b may be completely sealed. Since the screw 325 is fixed in the lower lid 300b by the taper washer 430e, the screw 325 does not rotate with the nut 435 when the nut 435 is being fastened. Thus, scratches caused due to friction between the screw 325 and the metal electrode 310 or an peeling-off of a protective layer formed on the surface may be prevented. The taper washer 430e may be formed of metal or resin.

In the above description, the dielectric plate 305 and the metal electrode 310 are fixed; however, the above fixing method may be applied to fix the metal cover 320 or the side cover 350. In addition, types shown in FIGS. 4A through 4C, the screw 325 may be fixed in the metal electrode 310 by means of press-fitting, shrinkage fit, welding, adhesion, and the like, or may be formed integrally with the metal electrode 310 in order to prevent the screw 325 from rotating. In addition, a key groove may be formed between the screw 325 and the lower lid 300b so that a key may be inserted into the key grooves to prevent the screw 325 from rotating. In addition, a hexagonal portion may be formed on a lower end (upper end) portion of the screw 325, so that the screw 325 may be fastened while being pushed by a wrench.

According to the microwave plasma processing apparatus 10 of the embodiments of the present invention, the upper gas shower plate, the lower gas nozzles, or the lower gas shower plate is formed in order to control the supply of gas. In addition, the plurality of gas discharging holes are formed in the metal electrode 310, the metal lid 300, the metal cover 320, and the side cover 350, and thus, etching of the surface of the dielectric plate is prevented, and at the same time, the deposition of reaction products on the inner surface of the processing container may be suppressed, and thereby promoting the reduction of reducing the contamination or particles.

In addition, the first gas discharging holes 345a formed in the metal electrode 310, the second gas discharging holes 345b1 and 345b2 of the metal cover 320 and the side cover 350, and the fifth gas discharging holes 345d of the lid 300 may be formed on a convex portion that is formed on a surface of the lid 300, which faces the substrate. Since it is difficult to generate the plasma on the convex portion, generation of abnormal discharge is prevented around the gas discharging holes formed on the convex portion.

While very appropriate embodiments of the present invention have been explained with reference to the attached drawings, of course, the present invention is not limited to the embodiments. It will be understood by one of ordinary skill in the art that various modifications or corrections can be made without departing from the scope of the present invention defined by the claims.

For example, the plasma processing apparatus according to the present invention may only include the lower gas nozzles 370 shown in FIG. 7 or 10 without the upper gas shower head. Alternatively, a plural kinds of the upper gas shower heads and the lower gas nozzles described in the embodiments may be combined arbitrarily. The conventional lower gas nozzle 370 may be combined with the upper gas shower head having the throttle portion shown in FIG. 1 or 6. The lower gas nozzle 370 may be formed of ceramics.

In the above embodiments the microwave source 900 outputting the microwave of 915 MHz is used; however, a microwave source outputting the microwave of 896 MHz, 92 MHz, 2.45 GHz, and the like may be used. The microwave source is an example of an electromagnetic wave source generating electromagnetic wave for exciting the plasma, and if an electromagnetic wave source outputting the electromagnetic wave of 100 MHz or more is used, a magnetron or an high frequency power generator may be used as the electromagnetic wave source.

A shape of metal electrode 310 is not limited to a quadrangle, but may be formed as a triangle, a hexagon, or an octagon. In this case, shapes of the dielectric plate 305 and the metal cover 320 are the same as that of the metal electrode 310. The metal cover 320 may or may not be disposed. When the metal cover 320 is not formed, the gas passage may be directly formed in the lid 300.

The microwave plasma processing apparatus may minutely processes on an object to be processed by using plasma, such as film formation process, diffusion process, etching process, ashing process, plasma doping process, and the like.

For example, the plasma processing apparatus according to the present invention may process a large-area glass substrate, a circular silicon wafer, or an square SOI (Silicon On Insulator) substrate.

The plasma processing apparatus is not limited to the above-described microwave plasma processing apparatus, but may be applied to a RLSA (Radial Line Slot Antenna), a CMEP (Cellular Microwave Excitation Plasma) processing apparatus, an ICP (Inductively Coupled Plasma) processing apparatus, a capacity coupled plasma processing apparatus, an ECR (Electron Cyclotron Resonance), and the like. The CMEP processing apparatus is an apparatus that discharges the microwave transmitted through a waveguide into a processing container through a plurality of dielectric plates so that the plasma may be generated by the energy of the microwave. An example of the CMEP processing apparatus is disclosed in Japanese Laid-open Patent Publication No. 2007-273636.

Figure 21:
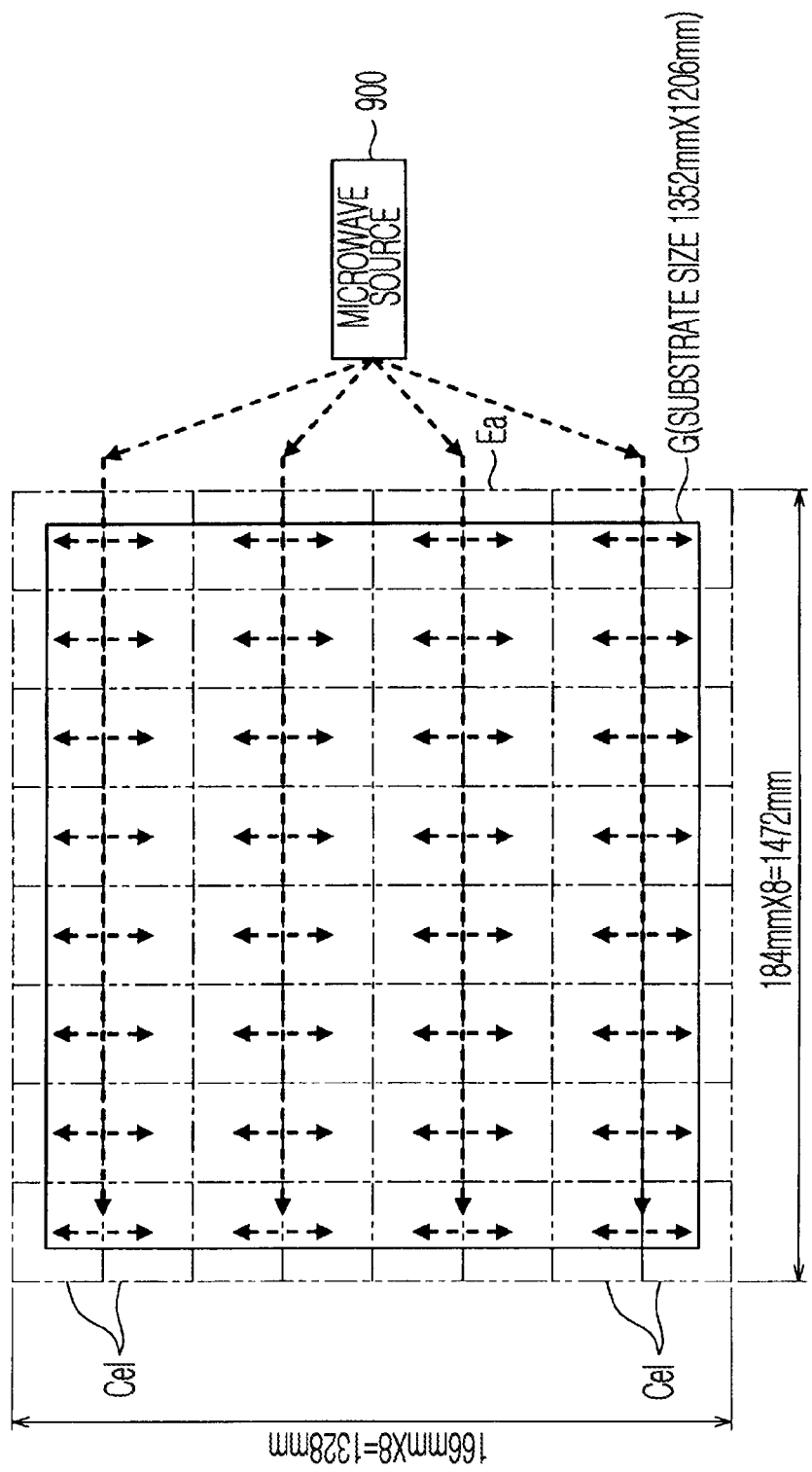
FIG. 21 is an image view of a plasma processing apparatus for solar battery according to an embodiment of the present invention.

The upper gas shower plate or the lower gas nozzle according to the present invention may be used in a plasma processing apparatus for solar battery, including a substrate having a size of 1352 mm×1206 mm, as shown in FIG. 21. In this case, cells Cel are arranged in 8 rows×8 columns ($=2^3 \times 2^3$), and thus, the plasma processing apparatus may have a substantially square shape. The microwave output from the microwave source propagates a branch circuit to distribute power, and then, is supplied to the cell Cel, and the conductor surface wave propagates the metal surface of the ceiling. In order to perform the plasma process evenly on the substrate G, a plasma excitation area (Ea) is designed to have a size greater than that of the substrate G.

The invention claimed is:

1. A plasma processing apparatus comprising:
a processing container which is formed of metal and receives a substrate that is plasma-processed;
an electromagnetic wave source which supplies electromagnetic waves required to excite the plasma inside of the processing container;
one, two, or more dielectric plates which are disposed on a lower surface of a lid of the processing container, are partially exposed to inside of the processing container, and transmit the electromagnetic wave supplied from the electromagnetic wave source to inside of the processing container; and
a metal electrode that is provided on a lower surface of the dielectric plate;
wherein the electromagnetic wave transmitted from the dielectric plates is propagated along a metal surface exposed to inside of the processing container, the metal surface comprising a lower surface of the metal electrode and a lower surface of the lid where the dielectric plate is not disposed,
wherein the plasma processing apparatus further comprises:
a gas supply source which supplies a desired gas;
a first gas discharging unit which discharge the gas supplied from the gas supply source to inside of the processing container; and
a gas flow passage which introduce the gas supplied from the gas supply source to the first gas discharging unit.

2. The plasma processing apparatus of claim 1,
wherein the first gas discharging unit comprises a plurality of first gas discharging holes formed in the metal electrode, and the gas is introduced into the processing container from the plurality of first gas discharging holes.

3. The plasma processing apparatus of claim 2, further comprising:
a metal cover that is disposed to be adjacent to the dielectric plate on the lower surface of the lid of the processing container, on which the dielectric plate is not disposed, and
a side cover that is adjacent to an outer portion of the dielectric plate and disposed on the lower surface of the lid where the dielectric plate is not disposed,
wherein the first gas discharging unit comprises a plurality of second gas discharging holes formed in the metal cover, and the gas is introduced into the processing container from the plurality of second gas discharging holes in the metal cover.

4. The plasma processing apparatus of claim 3,
wherein the first gas discharging unit comprises a plurality of third gas discharging holes formed in the side cover, and the gas is introduced into the processing container from the plurality of third gas discharging holes in the side cover.

5. The plasma processing apparatus of claim 4, wherein the gas flow passage comprises a first gas passage which is formed between the metal electrode and the dielectric plate, and the gas is introduced into the processing container from the plurality of first gas discharging holes through the first gas passage.

6. The plasma processing apparatus of claim 5, wherein the first gas passage is a groove formed on at least one of a surface of the metal electrode, which is adjacent to the dielectric plate, and a surface of the dielectric plate, which is adjacent to the metal electrode.

7. The plasma processing apparatus of claim 5, wherein the gas flow passage comprises a second gas passage which is formed between the metal cover and the side cover, and the lid, and the gas is introduced into the processing container from the plurality of second gas discharging holes in the metal cover and the plurality of third gas discharging holes in the side cover through the second gas passage.

8. The plasma processing apparatus of claim 7, wherein the second gas passage is a groove formed in surfaces of the metal cover and the side cover, which are adjacent to the lid, or a surface of the lid, which is adjacent to the metal cover and the side cover.

9. The plasma processing apparatus of claim 7, wherein the dielectric plate and the metal electrode are fixed on the lid by using a screw, the metal cover and the side cover are fixed on a main body of the lid by using a screw, the gas flow passage comprises a third gas passage formed in an inner portion of the screw, and the first and second gas passages are connected to the third gas passage.

10. The plasma processing apparatus of claim 9, wherein the first gas discharging unit comprises a plurality of fourth gas discharging holes formed in the plurality of screws, and the gas is introduced into the processing container from the plurality of fourth gas discharging holes through the third gas passages.

11. The plasma processing apparatus of claim 10, wherein the gas conductance of the plurality of fourth gas discharging holes is smaller than the gas conductance of the third gas passages.

12. The plasma processing apparatus of claim 11, wherein the fourth gas discharging hole is formed as a cylinder, and diameters and lengths of the first, second, third and fourth gas discharging holes are substantially the same as each other.

13. The plasma processing apparatus of claim 10, wherein the first gas discharging holes, the second gas discharging holes, the third gas discharging holes, and the fourth gas discharging holes are arranged at substantially regular pitches.

14. The plasma processing apparatus of claim 10, wherein at least any of the first gas discharging holes, the second gas discharging holes, the third gas discharging holes, and the fourth gas discharging holes is formed on a convex portion that is formed on a metal surface of at least one of the metal electrode, the metal cover, and the side cover.

15. The plasma processing apparatus of claim 10, wherein the gas flow passage comprises a fourth gas passage which is formed on an inner side surface of the screw and communicated with the third gas passage, and the gas that has passed through the third gas passage is introduced into the first or second gas passage through the fourth gas passage.

16. The plasma processing apparatus of claim 15, wherein the gas conductances of the first gas passage, the second gas passage, and the third gas passage are greater than the gas conductance of the fourth gas passage.

17. The plasma processing apparatus of claim 16, wherein the gas conductance of the fourth gas discharging hole is substantially the same as the gas conductance of the fourth gas passage.

18. The plasma processing apparatus of claim 17, wherein the fourth gas passage and the fourth gas discharging hole are formed as cylinders, and diameter and length of the fourth gas passage are substantially the same as the diameter and length of the fourth gas discharging hole.

19. The plasma processing apparatus of claim 9, wherein the gas flow passage comprises a main passage connected to the gas supply source and a throttle portion is disposed to be adjacent to the main gas passage so that the gas conductance of the third gas passage is smaller than the gas conductance of the main gas passage.

20. The plasma processing apparatus of claim 7, wherein the dielectric plate and the metal electrode are fixed on the lid by using a screw and the metal cover and the side cover are fixed on a main body of the lid by using a screw, and wherein the gas flow passage comprises a fifth gas passage which is formed between the screw and the lid, and the gas is introduced into the plurality of first gas discharging holes and the plurality of second gas discharging holes from the first and second gas passages through the fifth gas passage.

21. The plasma processing apparatus of claim 20, wherein the gas flow passage comprises a sixth gas passage which is communicated with the fifth gas passage and a main gas passage which is communicated with the sixth gas passage, and the gas that has passed through the main gas passage is introduced to the fifth gas passage through the sixth gas passage.

22. The plasma processing apparatus of claim 21, wherein the sixth gas passage is disposed so as to be inclined toward the object to be processed.

23. The plasma processing apparatus of claim 21, wherein a throttle portion is disposed to be adjacent to the main gas passage so that the gas conductance of the sixth gas passage is smaller than the gas conductance of the main gas passage.

24. The plasma processing apparatus of claim 6, wherein the groove has a depth of 0.2 mm or less.

25. The plasma processing apparatus of claim 4, wherein the gas flow passage comprises a gas passage which is formed inside the metal cover and the side cover, and the gas is introduced into the processing container from the plurality of second gas discharging holes in the metal cover and the plurality of third gas discharging holes in the side cover through the gas passage.

26. The plasma processing apparatus of claim 4, wherein the first gas discharging holes, the second gas discharging holes, and the third gas discharging holes are arranged substantially at regular pitches.

27. The plasma processing apparatus of claim 2, wherein the gas flow passage comprises a gas passage which is formed inside the metal electrode, and the gas is introduced into the processing container from the plurality of first gas discharging holes through the first gas passage.

28. The plasma processing apparatus of claim 1, wherein the first gas discharging unit comprises a plurality of gas discharging holes formed in the lid that is exposed to inside of the processing container, and the gas is introduced into the processing container from the plurality of gas discharging holes formed in the lid.

29. The plasma processing apparatus of claim 28, wherein the metal electrode is disposed on each surface of the dielectric plates that face the processing container, the first gas discharging unit comprises a plurality of first gas discharging holes formed in the metal electrode, and the gas is introduced into the processing container from the plurality of gas discharging holes formed in the lid and the first gas discharging holes.

30. The plasma processing apparatus of claim 29, wherein the first gas discharging hole and the gas discharging hole formed in the lid are formed as cylinders, and diameters and lengths of the first gas discharging holes and the gas discharging holes formed in the lid are substantially the same as each other.

31. The plasma processing apparatus of claim 28, wherein the gas flow passage comprises a gas passage which is formed inside the lid, and the gas is introduced into the processing container from the gas discharging holes formed in the lid through the gas passage which is formed inside the lid.

32. The plasma processing apparatus of claim 28, wherein the dielectric plate and the metal electrode are fixed on the lid by using a screw, the first gas discharging unit comprises a gas discharging hole formed in the screw, and the gas conductance of the gas discharging hole formed in the lid and the gas conductance of the gas discharging hole formed in the screw are substantially the same as each other.

33. The plasma processing apparatus of claim 32, wherein the gas discharging hole formed in the screw has substantially the same size as the gas discharging hole formed in the lid.

34. The plasma processing apparatus of claim 1, wherein the gas flow passage comprises a plurality of main gas passages which are formed inside the lid and a plurality of branch gas passages which are communicated with the plurality of main gas passage, and the plurality of main gas passages distribute the gas into the plurality of branch gas passages.

35. The plasma processing apparatus of claim 1, wherein the lid comprises an upper lid and a lower lid, and the gas flow passage comprises a main gas passage which is formed on a boundary between the upper lid and the lower lid.

36. The plasma processing apparatus of claim 1, further comprising a second gas discharging unit which is disposed between a space beneath the lid and a space for receiving the substrate in an inner space of the processing container, and discharges a gas supplied from a gas supply source that is different from the gas supply source toward the space for receiving the substrate.

37. A plasma processing apparatus comprising:
a processing container which is formed of metal and receives a substrate that is plasma-processed;
an electromagnetic wave source which supplies electromagnetic waves required to excite the plasma in the processing container;
one, two, or more dielectric plates which are disposed on a lower surface of a lid of the processing container, are partially exposed to inside of the processing container, and transmit the electromagnetic wave supplied from the electromagnetic wave source to inside of the processing container; and
a metal electrode that is provided on a lower surface of the dielectric plate;
wherein the electromagnetic wave transmitted from the dielectric plates is propagated along a metal surface exposed to inside of the processing container, the metal surface comprising a lower surface of the metal electrode and a lower surface of the lid where the dielectric plate is not disposed, wherein the plasma processing apparatus further comprises:
a first gas supply source which supplies a first gas including a plasma excitation gas;
a second gas supply source which supplies a desired second gas;
a first gas discharging unit which discharges the first gas supplied from the first gas supply source into a first space that is an inner space of the processing container, which is adjacent to the lower surface of the lid; and
a second gas discharging unit which discharges the second gas supplied from the second gas supply source into a second space that is an inner space of the processing container formed between the first space and a space for receiving the substrate.

38. The plasma processing apparatus of claim 37, wherein the second gas discharging unit comprises a plurality of gas passages passing through the inside of the lid and extending to near the second space, and at least one gas discharging hole formed in each of the gas passages to discharge the second gas into the second space.

39. The plasma processing apparatus of claim 38, wherein the plurality of gas passages comprise a first gas pipe disposed substantially perpendicularly to the object to be processed, and a plurality of second gas pipes that are connected to the first gas pipe in substantially parallel with the object to be processed.

40. The plasma processing apparatus of claim 39, wherein the plurality of second gas pipes are disposed at substantially regular angle intervals around the first gas pipe.

41. The plasma processing apparatus of claim 39, wherein a plurality of first gas pipes are arranged at regular pitches, and four second gas pipes are connected to each of the first gas pipes.

42. The plasma processing apparatus of claim 38, wherein the at least one gas discharging holes are formed at regular pitches in a surface of the plurality of second pipes, which faces the object to be processed.

43. The plasma processing apparatus of claim 38, wherein the plurality of gas passages comprise third gas pipes that are disposed at a predetermined angle with respect to the object to be processed.

44. The plasma processing apparatus of claim 43, wherein the third gas pipes extend from a plurality of portions on the lower surface of the lid to near the second space and, on each of the plurality of portions, a plurality of third gas pipes are formed in different directions to each other at substantially regular angle intervals.

45. The plasma processing apparatus of claim 43, wherein the gas discharging holes are formed on end portions of the plurality of third gas pipes, and the gas discharging holes are arranged at substantially regular pitches on a same plane that is parallel with the object to be processed.

46. The plasma processing apparatus of claim 37, wherein the second gas discharging unit is formed of a porous material.

47. The plasma processing apparatus of claim 37, wherein the second gas discharging unit is a slit-shaped opening.

* * * * *